United States Patent
Oh et al.

(10) Patent No.: US 11,982,705 B2
(45) Date of Patent: May 14, 2024

(54) SUBSTRATE ANALYSIS APPARATUS AND SUBSTRATE ANALYSIS METHOD

(71) Applicant: SAMSUNG ELECTRONICS CO., LTD., Suwon-si (KR)

(72) Inventors: Youn Gon Oh, Hwaseong-si (KR); Ji Hun Kim, Uiwang-si (KR); Sae Yun Ko, Hwaseong-si (KR); Gil Ho Gu, Hwaseong-si (KR); Dong Su Kim, Hwaseong-si (KR); Eun Hee Lee, Hwaseong-si (KR); Ho Chan Lee, Seoul (KR); Seong Sil Jeong, Incheon (KR); Seong Pyo Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 265 days.

(21) Appl. No.: 17/690,317

(22) Filed: Mar. 9, 2022

(65) Prior Publication Data

US 2023/0067060 A1 Mar. 2, 2023

(30) Foreign Application Priority Data

Aug. 31, 2021 (KR) .......................... 10-2021-0115188

(51) Int. Cl.
*G01R 31/28* (2006.01)
*H01L 21/673* (2006.01)
*H01L 21/677* (2006.01)

(52) U.S. Cl.
CPC ...... *G01R 31/2831* (2013.01); *H01L 21/6735* (2013.01); *H01L 21/6773* (2013.01)

(58) Field of Classification Search
CPC ... G01R 31/28; G01R 31/2831; H01L 21/673; H01L 21/677; H01L 21/67207;
(Continued)

(56) References Cited

U.S. PATENT DOCUMENTS 6,567,718 B1 5/2003 Campbell et al.
7,661,921 B2 2/2010 Kim et al.
(Continued)

FOREIGN PATENT DOCUMENTS

| CN | 1656598 A | * | 8/2005 | ....... H01L 21/67288 |
| JP | 2012-111635 A | | 6/2012 | |
| JP | 2020-194889 A | | 12/2020 | |

OTHER PUBLICATIONS

English Translation of Brunner et al. CN 1656598 A "Large Substrate Test System" (Year: 2005).*

*Primary Examiner* — Jermele M Hollington
*Assistant Examiner* — Courtney G McDonnough
(74) *Attorney, Agent, or Firm* — Sughrue Mion, PLLC

(57) ABSTRACT

A substrate analysis apparatus is provided. The substrate analysis includes: an interlayer conveying module configured to transport a first FOUP; an exchange module which is connected to the interlayer conveying module, and configured to transfer a wafer from the first FOUP to a second FOUP; a pre-processing module configured to form a test wafer piece using the wafer inside the second FOUP; an analysis module configured to analyze the test wafer piece; and a transfer rail configured to transport the second FOUP containing the wafer and a tray containing the test wafer piece. The wafer includes a first identifier indicating information corresponding to the wafer, the test wafer piece includes a second identifier indicating information generated by the pre-processing module which corresponds to the test wafer piece, and the analysis module is configured to analyze the first identifier and the second identifier in connection with each other.

20 Claims, 30 Drawing Sheets

(58) Field of Classification Search
CPC ......... H01L 21/67271; H01L 21/67288; H01L 21/67294; H01L 21/6735; H01L 21/67706; H01L 21/67727; H01L 21/6773; H01L 21/67733; H01L 21/67745; H01L 21/67769; H01L 22/00
USPC .................................................. 324/757.03
See application file for complete search history.

(56) References Cited

U.S. PATENT DOCUMENTS

| | | | |
|---|---|---|---|
| 8,944,739 B2* | 2/2015 | Chen | H01L 21/67733 |
| | | | 414/217 |
| 9,581,641 B2 | 2/2017 | Yamada | |
| 10,490,463 B2 | 11/2019 | Lin et al. | |
| 10,510,571 B2 | 12/2019 | Chang | |
| 2014/0093984 A1* | 4/2014 | Itou | H01L 21/67155 |
| | | | 15/21.1 |

* cited by examiner

S520, S530

SUBSTRATE ANALYSIS APPARATUS AND SUBSTRATE ANALYSIS METHOD

CROSS-REFERENCE TO RELATED APPLICATION

This application claims priority from Korean Patent Application No. 10-2021-0115188 filed on Aug. 31, 2021 in the Korean Intellectual Property Office, the disclosure of which is incorporated by reference herein in its entirety.

BACKGROUND

1. Field

The present disclosure relates to transportation and storage processes of a wafer from a FAB to a FAB-OUT, and fracture structure analysis of the wafer.

2. Description of Related Art

As semiconductor processes are gradually miniaturized, an aspect ratio of semiconductor devices increases. As the aspect ratio increases, the difficulty of semiconductor processes gradually becomes difficult. Therefore, the wafer fracture analysis for mechanism analysis of the semiconductor processes also increases in difficulty.

A related wafer fracture analysis process has been performed manually from wafer input to sample production and imaging/analysis. When performed manually, there may be a reliability problem about setting of a fracture analysis region, a problem about damage to a region of interest according to manual work, and a safety problem. Further, because command/feedback for the work position information is impossible, there is no method for checking the position information of the work.

SUMMARY

One or more example embodiments provide a substrate analysis apparatus having improved efficiency and productivity.

One or more example embodiments provide a substrate analysis method having improved efficiency and productivity.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of an example embodiment, a substrate analysis apparatus includes: an interlayer conveying module which is provided in a first region of the substrate analysis apparatus, and configured to transport a first Front Opening Unified Pod (FOUP) configured to store a plurality of wafers in a vertical direction; an exchange module which is connected to the interlayer conveying module, and configured to transfer a wafer, from among the plurality of wafers, from the first FOUP to a second FOUP provided in a second region of the substrate analysis apparatus different from the first region; a pre-processing module which is provided in the second region, and configured to form a test wafer piece using the wafer inside the second FOUP; an analysis module which is provided in the second region, and configured to analyze the test wafer piece; and a transfer rail which is provided in the second region, and configured to transport the second FOUP containing the wafer and a tray containing the test wafer piece. The wafer includes a first identifier indicating information corresponding to the wafer, the test wafer piece includes a second identifier indicating information generated by the pre-processing module which corresponds to the test wafer piece, and the analysis module is configured to analyze the first identifier and the second identifier in connection with each other.

According to an aspect of an example embodiment, a substrate analysis apparatus includes: an exchange module configured to transfer a wafer between a process chamber and an analysis chamber; a pre-processing module which is provided on a bottom surface of the analysis chamber and configured to form a test wafer piece using the wafer; an analysis module which is provided on the bottom surface of the analysis chamber and configured to analyze the test wafer piece; and a transfer rail which is provided on a ceiling of the analysis chamber and configured to transport the wafer from the exchange module to the pre-processing module, and a tray containing the test wafer piece from the pre-processing module to the analysis module.

According to an aspect of an example embodiment, a substrate analysis method includes: transferring a first Front Opening Unified Pod (FOUP) in which a plurality of wafers are stored, using an interlayer conveying module provided in a first region of a substrate analysis apparatus, information about a wafer, from among the plurality of wafers, being stored in a first identifier; transferring the wafer from the first region to a second region of the substrate analysis apparatus different from the first region, using an exchange module connected to the interlayer conveying module, the wafer being stored in a second FOUP inside the exchange module; transferring the wafer from the exchange module to a pre-processing module along a transfer rail provided in the second region; forming a test wafer piece using the pre-processing module; generating a second identifier indicating information corresponding to the test wafer piece; placing the test wafer piece in a tray; transferring the tray containing the test wafer piece to an analysis module along the transfer rail; analyzing the test wafer piece, using the analysis module; and analyzing the first identifier and the second identifier in connection with each other.

BRIEF DESCRIPTION OF THE DRAWINGS

The above and other aspects and features will be more apparent from the following description of example embodiments taking in conjunction with the attached drawings, in which.

DETAILED DESCRIPTION

Hereinafter, example embodiments will be described with reference to the accompanying drawings.

Figure 1:
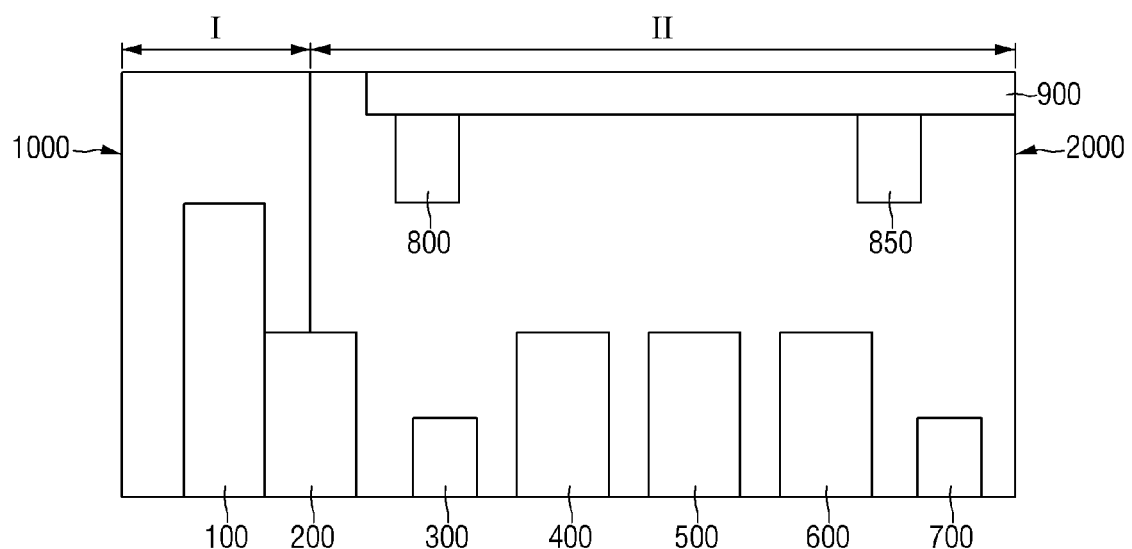
FIG. 1 is a conceptual diagram for explaining a substrate analysis apparatus according to some example embodiments.

FIG. 1 is a conceptual diagram for explaining a substrate analysis apparatus according to some example embodiments. Hereinafter, the substrate analysis apparatus will be described using FIG. 1.

Referring to FIG. 1, the substrate analysis apparatus according to some example embodiments includes a first region I and a second region II.

The first region I may be a region in which a semiconductor process is performed, and the second region II may be a region in which wafer analysis is performed. The first region I may be, for example, a process chamber 1000, and the second region II may be, for example, an analysis chamber 2000. The first region I may be a clean region. The second region II may be a non-clean region. Although the first region I and the second region II are shown to be adjacent to each other, example embodiments are not limited thereto. The first region I and the second region II may be adjacent to each other or may be spaced apart from each other.

In some example embodiments, the substrate analysis apparatus includes an interlayer conveying module 100, an exchange module 200, a wafer stocker 300, a pre-processing module 400, a sample production module 500, an analysis module 600, a tray stocker 700, a Front Opening Unified Pod (FOUP) transfer module 800, a tray transfer module 850, and a transfer rail 900.

The interlayer conveying module 100 may be installed in the first region I. The interlayer conveying module 100 may be installed inside the process chamber 1000. The interlayer conveying module 100 may transfer or transport a first FOUP (e.g., F1 of FIG. 5A) in a vertical direction. The first FOUP may include a plurality of first wafers (e.g., W1 of FIG. 5A). The first FOUP may store a plurality of first wafers.

The interlayer conveying module 100 may include a plurality of stages spaced apart from each other in the vertical direction. The interlayer conveying module 100 may transfer the first FOUP between stages. For example, when the interlayer conveying module 100 includes a first stage and a second stage spaced apart from each other in the vertical direction, the interlayer conveying module 100 may transfer the first FOUP from the first stage to the second stage. Further, the interlayer conveying module 100 may transfer the first FOUP from the second stage to the first stage.

The exchange module 200 may be connected to the interlayer conveying module 100. For example, the exchange module 200 may be directly connected to the interlayer conveying module 100. The exchange module 200 may be installed at a boundary between the first region I and the second region II. The exchange module 200 may be installed at a boundary between the process chamber 1000 and the analysis chamber 2000. However, example embodiments are not limited thereto.

The exchange module 200 may transport the first wafer in the first region I to the second region II. The exchange module 200 may transport the first wafer in the process chamber 1000 to the analysis chamber 2000. For example, the exchange module 200 may receive the first wafer from the interlayer conveying module 100. The exchange module 200 may store the first wafer received from the interlayer conveying module 100 in a second FOUP (e.g., F2 of FIG. 6). More specifically, the first FOUP transported from the interlayer conveying module 100 may be loaded into the exchange module 200. The first wafer in the first FOUP may be unloaded from the first FOUP and loaded into the second FOUP. Information about the first wafer may be stored in a first ID (e.g., identifier).

The wafer stocker 300 may be installed inside the second region II. The wafer stocker 300 may be installed inside the analysis chamber 2000. For example, the wafer stocker 300 may be installed on a bottom surface of the analysis chamber 2000. The wafer stocker 300 may computerize the first wafer. The wafer stocker 300 may computerize the first wafer to form a second wafer (e.g., W2 of FIG. 9). For example, the computerized first wafer may be a second wafer.

Further, the wafer stocker 300 may store the second wafer. Further, the wafer stocker 300 may discard a wafer (a disposal wafer, for example, W4 of FIG. 13) that remains after forming a first test wafer piece (for example, W3 of FIG. 13). Further, the wafer stocker 300 may store the disposal wafer, and the stored disposal wafer may be reused later. The disposal wafer may be stored for a preset period, and when the period elapses, the disposal wafer may be automatically transferred to a disposal box and discarded. This may be reported to a parent system by a computer of the substrate analysis apparatus.

The pre-processing module 400 may be installed in the second region II. The pre-processing module 400 may be installed inside the analysis chamber 2000. For example, the pre-processing module 400 may be installed on the bottom surface of the analysis chamber 2000. The pre-processing module 400 may perform pre-processing operations. The pre-processing operations may include formation of the first test wafer piece and formation of the disposal wafer.

For example, the pre-processing module 400 may form the first test wafer piece and the disposal wafer, using the second wafer. Further, the pre-processing module 400 may generate a second ID (e.g., identifier) including information on the first test wafer piece. The formation of the first test wafer piece and the disposal wafer will be described in detail below using FIGS. 10 to 15.

The sample production module 500 may be installed inside the second region II. The sample production module 500 may be installed inside the analysis chamber 2000. For example, the sample production module 500 may be installed on the bottom surface of the analysis chamber 2000. The sample production module 500 may produce a sample for testing a wafer. The first test wafer piece may be loaded into the sample production module 500. After that, the sample production operations may be performed. When the sample production operations are performed, a second test wafer piece (for example, W5 of FIG. 18) may be formed. The test wafer piece (the second test wafer piece) for which the sample production operations have been completed may be fixed to a defined stub, and a position fixed to the stub may be stored in the second ID. This may be reported to the host system by a computer of the substrate analysis apparatus. The stub may be fixed to a tray, and information about the position of the second test wafer piece is stored in the tray ID (e.g., identifier) assigned in advance.

The analysis module 600 may be installed inside the second region II. The analysis module 600 may be installed inside the analysis chamber 2000. For example, the analysis module 600 may be installed on the bottom surface of the analysis chamber 2000. The analysis module 600 may perform photographing/analysis operations on the second test wafer piece. When the imaging/analysis operations are performed on the second test wafer piece, a third test wafer piece (for example, W6 of FIG. 21) may be formed.

The tray stocker 700 may be installed inside the second region II. The tray stocker 700 may be installed inside the analysis chamber 2000. For example, the tray stocker 700 may be installed on the bottom surface of the analysis chamber 2000. The tray stocker 700 may computerize the tray. Further, the tray stocker 700 may store the tray. The tray may store the first to third test wafer pieces. For example, a plurality of first to third test wafer pieces may be placed in the tray and transported, and the tray may be stored. The tray stocker 700 may automatically store the tray loaded into the tray stocker 700. The tray stocker 700 may generate a tray ID including tray information. The tray ID may store a second ID including information on the test wafer piece that is placed in the tray. This is reported to the host system by a computer of the substrate analysis apparatus. The tray ID may be loaded with all kinds of information about the test wafer pieces. The tray ID is centrally controlled. The tray ID may be used to track the history of future analysis processes. After that, the analysis operations may proceed.

The transfer rail 900 may be installed inside the second region II. The transfer rail 900 may be installed inside the analysis chamber 2000. The transfer rail 900 may be installed on the ceiling of the analysis chamber 2000. The transfer rail 900 may transport wafers and test wafer pieces.

The first wafer may be transported from the exchange module 200 to the wafer stocker 300 along the transfer rail 900.

Further, the first wafer may be transported from the exchange module 200 to the wafer stocker 300 along the transfer rail 900. The second wafer may be transported from the wafer stocker 300 to the pre-processing module 400 along the transfer rail 900. The first to third test wafer pieces may be transported to the pre-processing module 400, the sample production module 500, the analysis module 600, and the tray stocker 700 along the transfer rail 900. The disposal wafer may be transported from the pre-processing module 400 to the wafer stocker 300 along the transfer rail 900.

The FOUP transfer module 800 may be a module that transports a first wafer, a second wafer, and a disposal wafer. The FOUP transfer module 800 may be a module that transports a second FOUP. That is, the first wafer, the second wafer, and the disposal wafer may be placed in the second FOUP and transported by the FOUP transfer module 800.

The FOUP transfer module 800 may move along the transfer rail 900. The FOUP transfer module 800 may transport the second FOUP to the exchange module 200, the wafer stocker 300, and the pre-processing module 400.

The tray transfer module 850 may be a module for transporting the first to third test wafer pieces. The tray transfer module 850 may be a module for transporting the trays. That is, the first to third test wafer pieces may be placed in the tray and transported. The tray transfer module 850 may move along the transfer rail 900. The tray transfer module 850 may transfer the tray to the pre-processing module 400, the sample production module 500, the analysis module 600, and the tray stocker 700.

When using the substrate analysis apparatus according to some example embodiments, it is possible to simplify and automate the operations of carrying out the wafer in the process chamber to the analysis chamber, and analyzing the wafer in the analysis chamber. Productivity and efficiency can increase accordingly.

Figure 2:
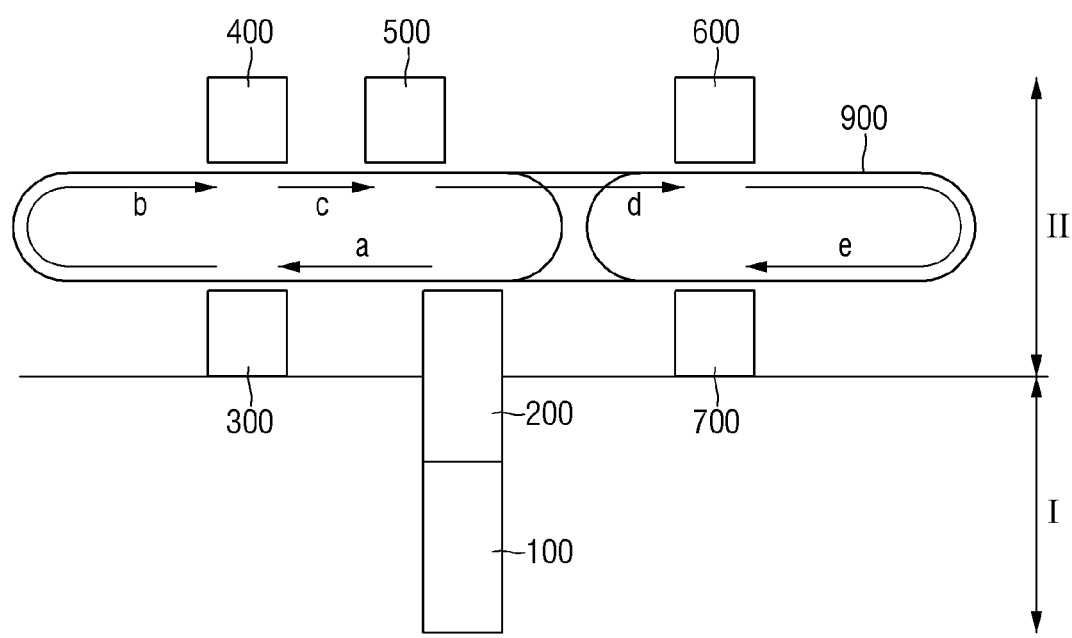
FIG. 2 is a layout diagram for explaining operation of a substrate analysis apparatus according to some example embodiments.

FIG. 2 is a layout diagram for explaining the operation of the substrate analysis apparatus according to some example embodiments. Hereinafter, the operation of the substrate analysis apparatus according to some example embodiments will be described referring to FIGS. 1 and 2.

Referring to FIGS. 1 and 2, the first wafer may be loaded into the interlayer conveying module 100 in the first region I. The first wafer may be loaded into the interlayer conveying module 100 in the process chamber 1000.

The interlayer conveying module 100 may store the first wafer in the first FOUP. The interlayer conveying module 100 may transport the first FOUP in the vertical direction.

Subsequently, the interlayer conveying module 100 may transfer the first FOUP to the exchange module 200. The exchange module 200 may transport the first wafer in the first FOUP to the second region II. The exchange module 200 may transport the first wafer in the first FOUP to the analysis chamber 2000. For example, the exchange module 200 may unload the first wafer from the first FOUP and store the first wafer in the second FOUP.

Next, the second FOUP that stores the first wafer may be moved from the exchange module 200 to the wafer stocker 300 (see reference numeral a). The second FOUP is placed in the FOUP transfer module 800 and may move along the transfer rail 900. The second FOUP may be loaded into the wafer stocker 300.

Next, the wafer stocker 300 may unload the first wafer from the second FOUP. The wafer stocker 300 may computerize the first wafer. The wafer stocker may form a second wafer. The second wafer may be obtained by computerizing the first wafer. The wafer stocker 300 may store the second wafer. The second wafer may be placed in the second FOUP again and unloaded from the wafer stocker 300.

The second FOUP may then be loaded into the pre-processing module 400 along the transfer rail 900 (see reference numeral b). The second FOUP may be placed in the FOUP transfer module 800 and transported along the transfer rail 900. The pre-processing module 400 may form a first test wafer piece and a disposal wafer. The first test wafer piece may be stored in a tray. The disposal wafer may be stored in the second FOUP.

Subsequently, the tray in which the first test wafer piece is placed may be unloaded from the pre-processing module 400. The tray may be moved to the sample production module 500 along the transfer rail 900 (see reference numeral c). The tray may be placed in the tray transfer module 850 and transported. The tray may be loaded into the sample production module 500. The sample production module 500 may produce a sample for photographing/analyzing the first test wafer piece. The sample production module 500 may form a second test wafer piece. The second test wafer piece may be a test wafer piece from which a sample is produced.

Next, the second test wafer piece may be unloaded from the sample production module 500 and loaded into the analysis module 600 (see reference numeral d). The second test wafer piece is placed in the tray and may be moved along the transfer rail 900. The tray may be placed in the tray transfer module 850 and transported. The second test wafer piece may be photographed/analyzed in the analysis module 600. A third test wafer piece may be formed. The third test wafer piece may be a second test wafer piece for which photographing/analysis have been completed.

The third test wafer piece may be unloaded from the analysis module 600. The third test wafer piece may be transported to the tray stocker 700 along the transfer rail 900 (see reference numeral e). The third test wafer piece may be placed in the tray and transported. The tray stocker 700 may computerize and store the tray in which the third test wafer piece is placed.

If the analysis module 600 is in a full loading state, the second test wafer piece may not be immediately loaded from the sample production module 500 to the analysis module 600. In this case, the second test wafer piece unloaded from the sample production module 500 may be moved to the tray stocker 700. The tray in which the second test wafer piece is placed may be stored in the tray stocker 700 to be provided to the analysis module 600 when the analysis module 600 is not in the full loading state.

If both the sample production module 500 and the analysis module 600 are in the full loading state, the first test wafer piece may not be loaded from the pre-processing module 400 to the sample production module 500. In this case, the first test wafer piece unloaded from the pre-processing module 400 may be moved to the tray stocker 700. The tray in which the first test wafer piece is placed may be stored in the tray stocker 700 to be provided to the analysis module 600 when the analysis module 600 is not in the full loading state.

The disposal wafer generated by the pre-processing module 400 may be moved to the wafer stocker 300 again. The disposal wafer is placed in a second FOUP and may be moved to the wafer stocker 300 along the transfer rail 900. The disposal wafer is unloaded to the wafer stocker 300, and the wafer stocker 300 may discard the disposal wafer.

Figure 3:
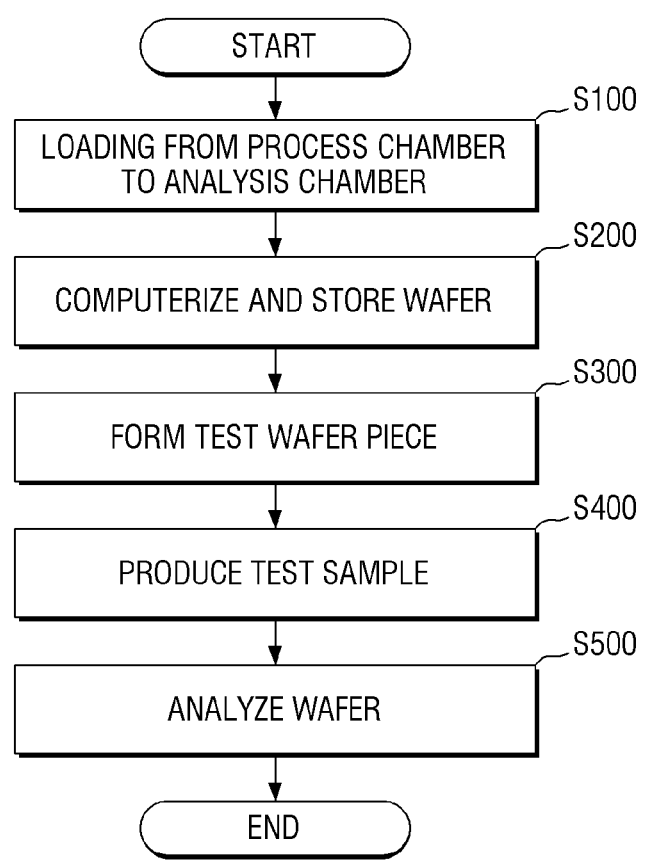
FIG. 3 is a flowchart for explaining a substrate analysis method according to some example embodiments.

FIG. 3 is a flowchart for explaining the substrate analysis method according to some example embodiments. Hereinafter, substrate analysis methods according to some example embodiments will be described referring to FIG. 3.

Referring to FIG. 3, the analysis method according to some example embodiments may include an operation of loading the wafer from the process chamber to the analysis chamber (S100), an operation of computerizing and storing the wafer (S200), an operation of forming the test wafer piece (S300), an operation of producing a test sample (S400), and an operation of analyzing the wafer (S500). Details of each operation will be described below using FIGS. 4 to 21.

Figure 4:
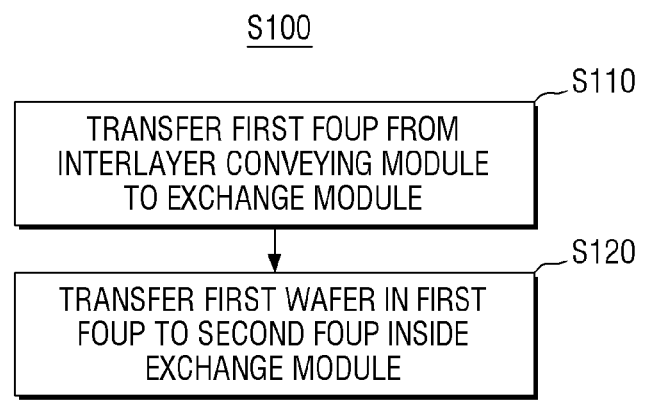
FIG. 4 is a flowchart for explaining operation S100 of FIG. 3.
Figure 5A:
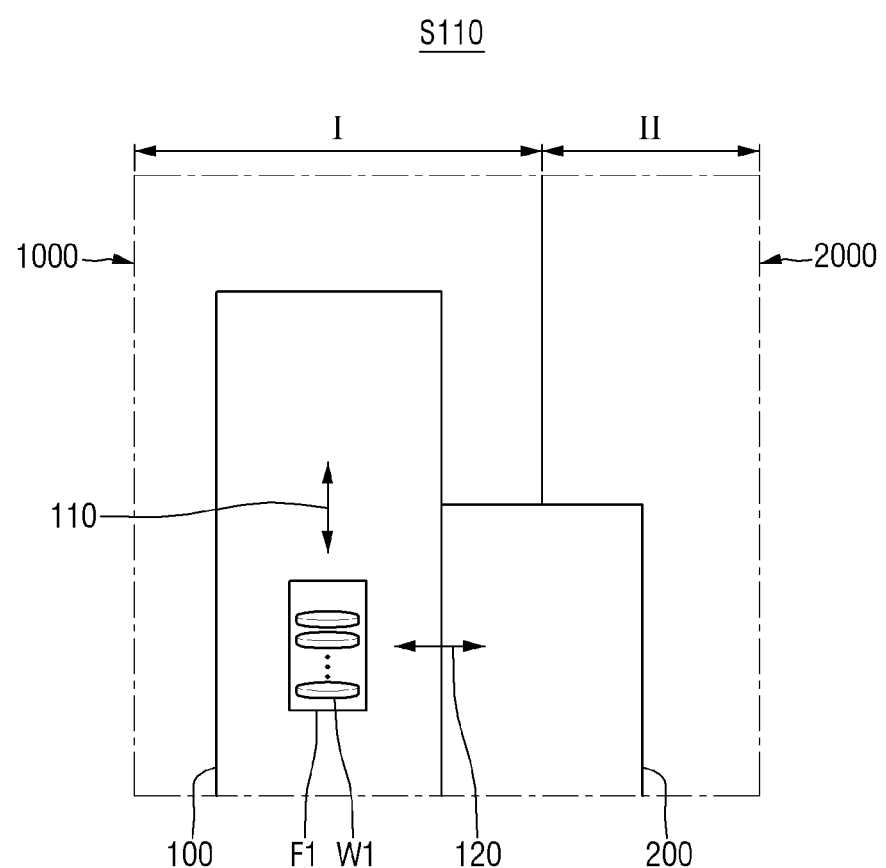
FIGS. 5A and 5B are diagrams for explaining operation S110 of FIG. 4.
Figure 5B:
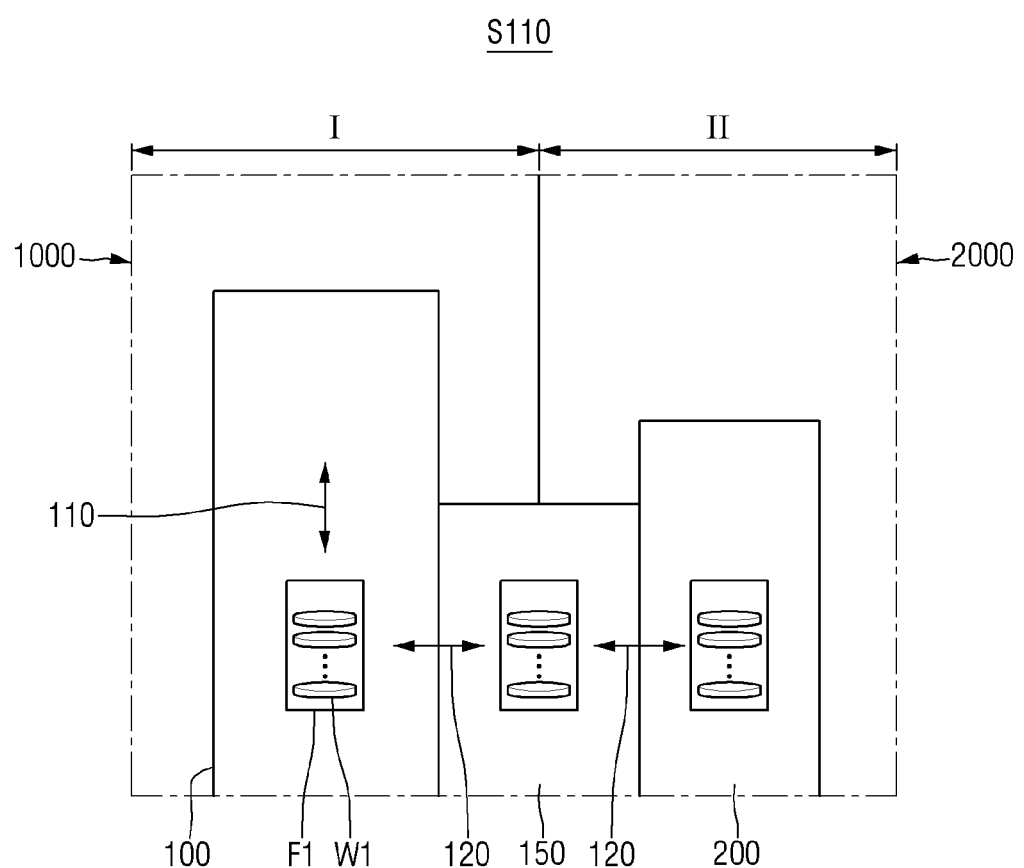
Figure 6:
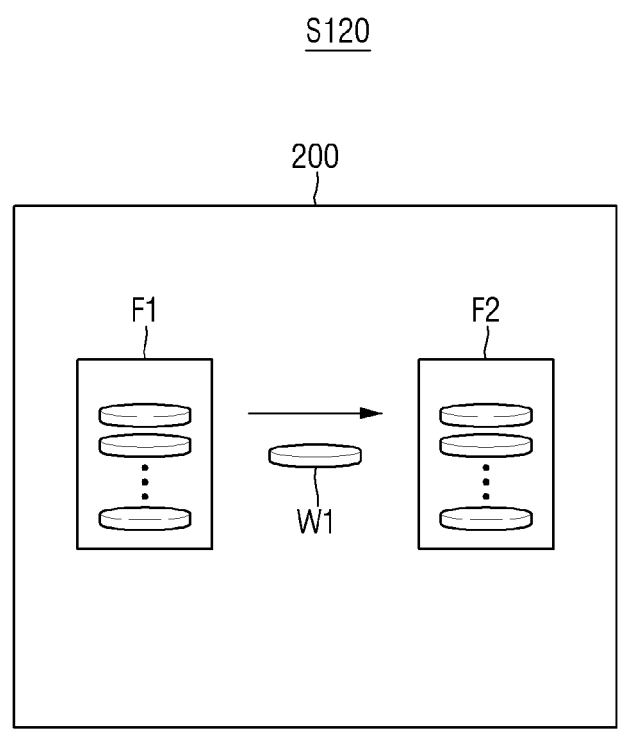
FIG. 6 is a diagram for explaining operation S120 of FIG. 4.

FIG. 4 is a flowchart for explaining operation S100 of FIG. 3. FIGS. 5A and 5B are diagrams for explaining operation S110 of FIG. 4. FIG. 6 is a diagram for explaining operation S120 of FIG. 4. Hereinafter, operation S100 of FIG. 4 will be described referring to FIGS. 4 to 6.

Referring to FIGS. 4 to 6, the operation of loading the wafer from the process chamber to the analysis chamber (S100) may include an operation of transferring the first FOUP F1 from the interlayer conveying module 100 to the exchange module 200 (S110), and an operation of transferring the first wafer W1 in the first FOUP F1 to the second FOUP F2 inside the exchange module 200 (S120).

In FIG. 5A, the interlayer conveying module 100 may be installed inside the first region I.

The interlayer conveying module 100 may be installed inside the process chamber 1000. The exchange module 200 may be installed at the boundary between the first region I and the second region II. The exchange module 200 may be installed at the boundary between the process chamber 1000 and the analysis chamber 2000. The exchange module 200 may be directly connected to the interlayer conveying module 100.

In the process chamber 1000, a plurality of first wafers W1 may be stored in the first FOUP F1. The first FOUP F1 may move in the vertical direction (see reference numeral 110) inside the interlayer conveying module 100. The interlayer conveying module 100 may transfer the first FOUP F1 in the vertical direction 110. The first FOUP F1 may be transferred from the interlayer conveying module 100 to the exchange module 200 in a horizontal direction (see reference numeral 120) (S110).

In FIG. 5B, the substrate analysis apparatus according to some example embodiments may further include an interface module 150.

The interface module 150 may be installed between the interlayer conveying module 100 and the exchange module 200. The interlayer conveying module 100 may not be directly connected to the exchange module 200. For example, the interlayer conveying module 100 may be connected to the exchange module 200, using the interface module 150.

The first FOUP F1 may be moved from the interlayer conveying module 100 to the interface module 150 in the horizontal direction 120. Subsequently, the first FOUP F1 may be moved from the interface module 150 to the exchange module 200. Although the drawing shows that the interface module 150 is installed between the process chamber 1000 and the analysis chamber 2000, example embodiments are not limited thereto. The interface module 150 may be installed inside the process chamber 1000.

In FIG. 6, the first wafer W1 inside the first FOUP F1 may be transferred to the second FOUP F2 (S120).

The first wafer W1 inside the first FOUP F1 may be transported to the second FOUP F2 inside the exchange module 200. The transfer of the first wafer W1 from the first FOUP F1 to the second FOUP F2 may be transfer of the first wafer W1 from the process chamber FOUP to the analysis chamber FOUP.

Figure 7:
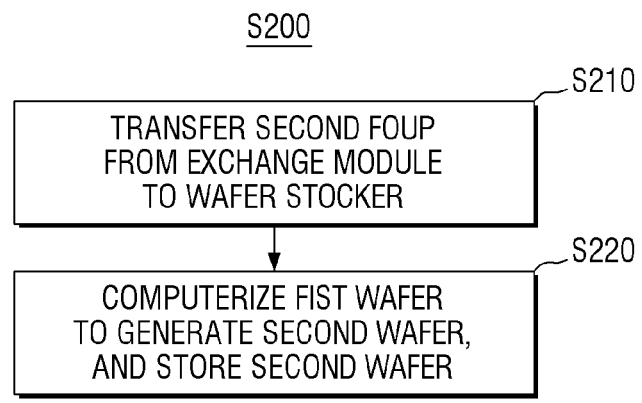
FIG. 7 is a flowchart for explaining operation S200 of FIG. 3.
Figure 8:
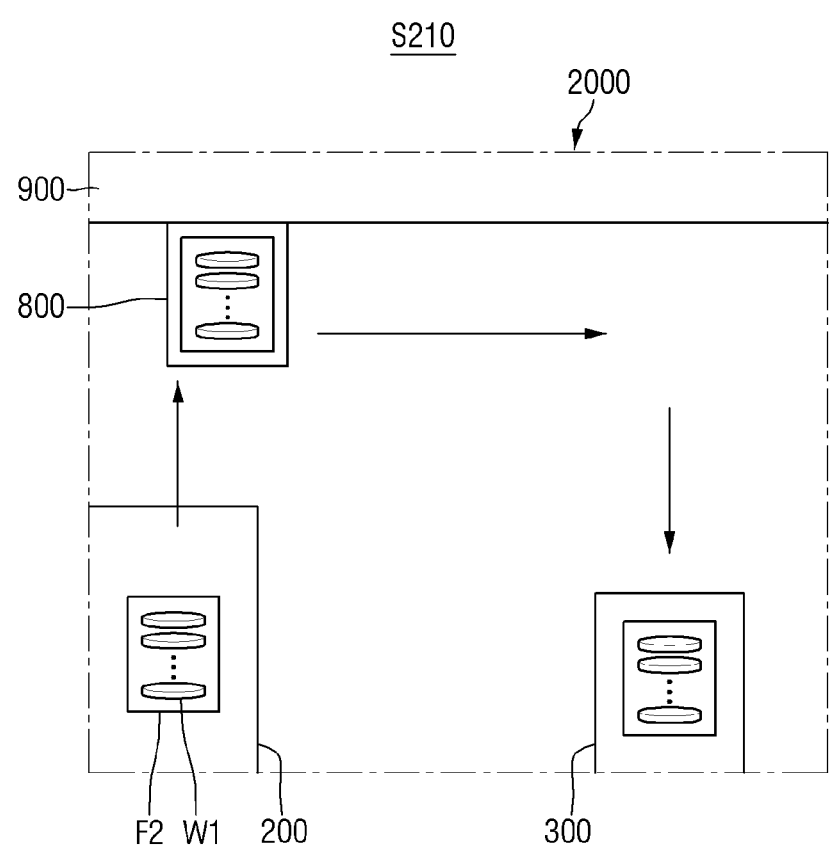
FIG. 8 is a diagram for explaining operation S210 of FIG. 7.
Figure 9:
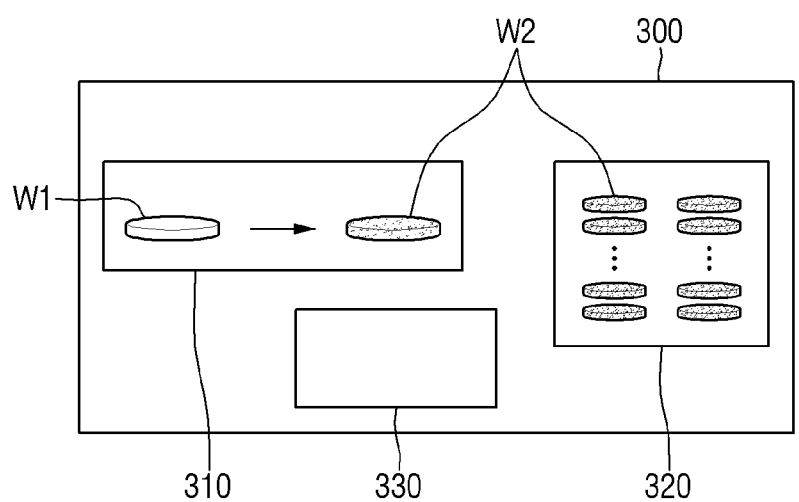
FIG. 9 is a diagram for explaining operation S220 of FIG. 7.

FIG. 7 is a flowchart for explaining operation S200 of FIG. 3. FIG. 8 is a diagram for explaining operation S210 of FIG. 7. FIG. 9 is a diagram for explaining operation S220 of FIG. 7. Hereinafter, operation S200 will be described in more detail referring to FIGS. 7 to 9.

Referring to FIGS. 7 to 9, the operation of computerizing and storing the wafer (S200) may include an operation of transferring the second FOUP F2 from the exchange module 200 to the wafer stocker 300 (S210), and an operation of computerizing and storing the first wafer W1 (S220).

In FIG. 8, the second FOUP F2 may be transferred from the exchange module 200 to the wafer stocker 300 (S210).

The second FOUP F2 may be unloaded from the exchange module 200. The FOUP transfer module 800 may include a hand (e.g., a robotic hand). The hand may move in the vertical direction. For example, the hand descends in the vertical direction and the hand may grip the second FOUP F2 inside the exchange module 200. The hand may then load the second FOUP F2 into the FOUP transfer module 800. The FOUP transfer module 800 may transport the second FOUP F2 to the wafer stocker 300 along the transfer rail 900. The second FOUP F2 may be loaded into the wafer stocker 300.

In FIG. 9, the wafer stocker 300 may computerize the first wafer W1 to generate second wafer W2 and store the second wafer W2 (S220).

The wafer stocker 300 may include a process chamber 310, a storage chamber 320, and a disposal chamber 330. The process chamber 310 may be a space for computerizing the first wafer W1. The storage chamber 320 may be a space for storing the second wafer W2. The second wafer W2 may be a computerized first wafer W1. The disposal chamber 330 may be a space that discards the disposal wafer.

First, the first wafer W1 may be unloaded from the second FOUP F2. Specifically, from the second FOUP F2 loaded into the wafer stocker 300, the first wafer W1 may be unloaded to the process chamber 310. The first wafer W1 may be computerized inside the process chamber 310. That is, the first wafer W1 may be computerized to form the second wafer W2.

The second wafer W2 may then be transported to the storage chamber 320. The second wafer W2 may be stored inside the storage chamber 320.

Figure 10:
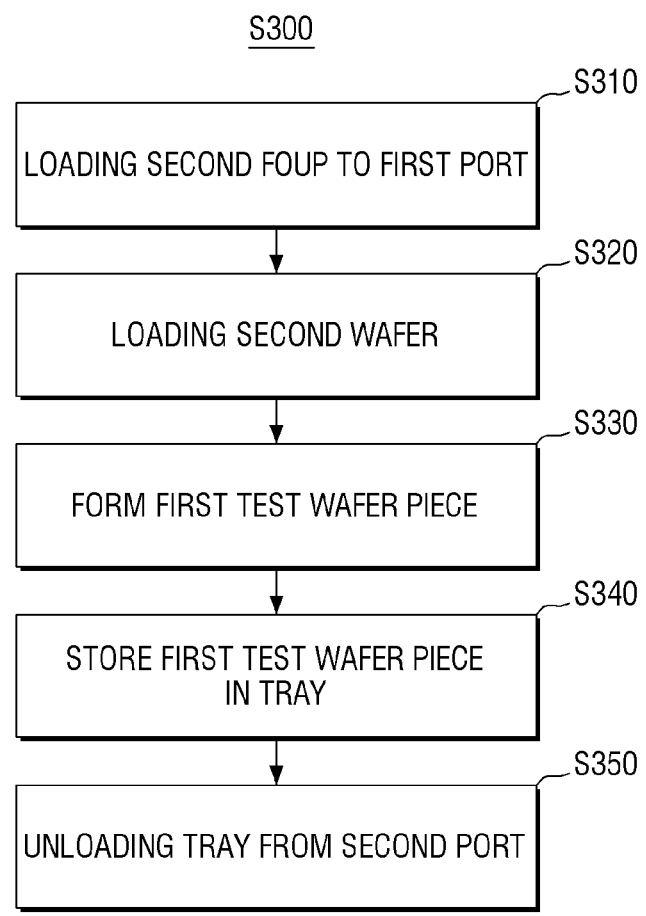
FIG. 10 is a flowchart for explaining operation S300 of FIG. 3.
Figure 11:
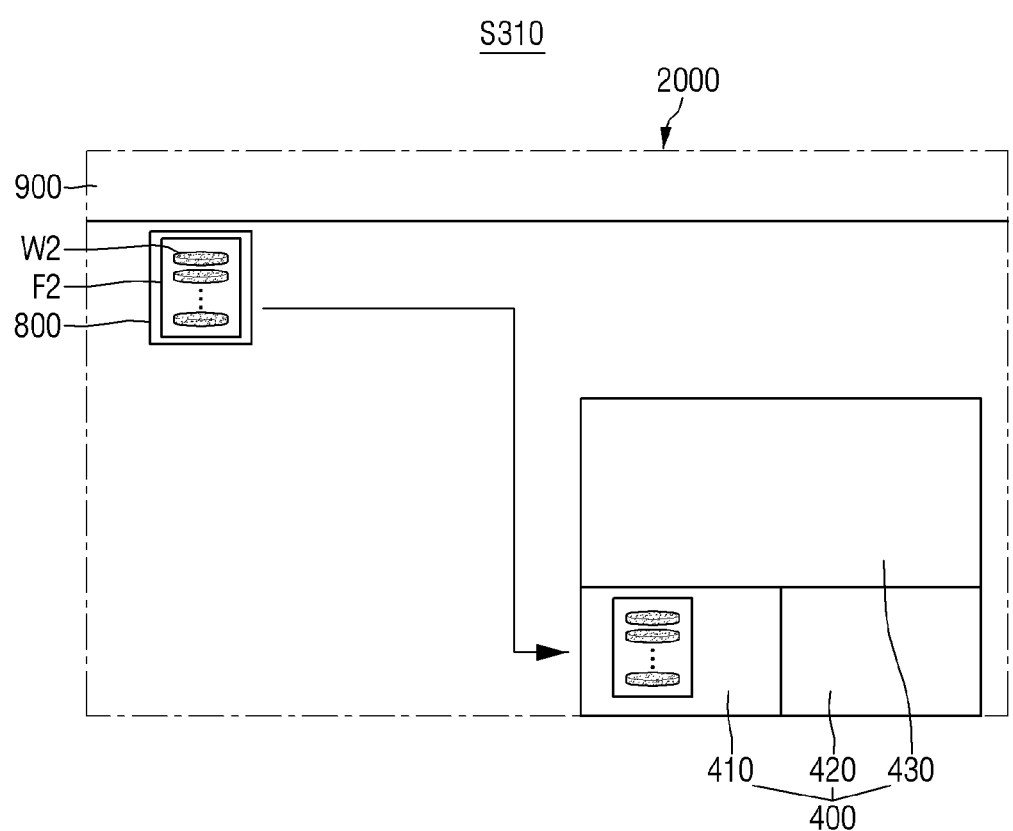
FIG. 11 is a diagram for explaining operation S310 of FIG. 10.
Figure 12:
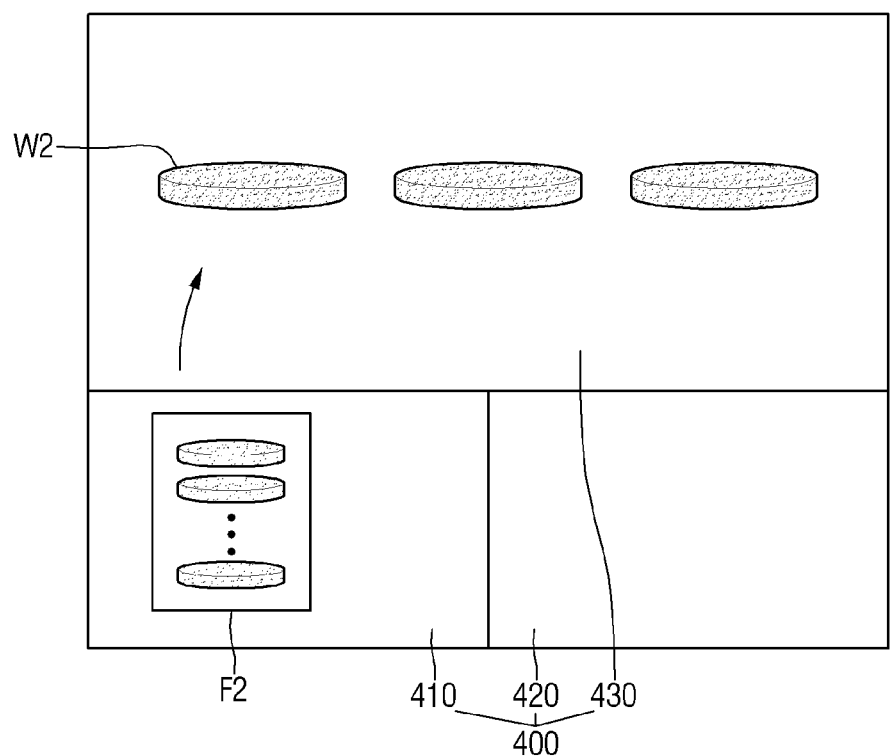
FIG. 12 is a diagram for explaining operation S320 of FIG. 10.
Figure 13:
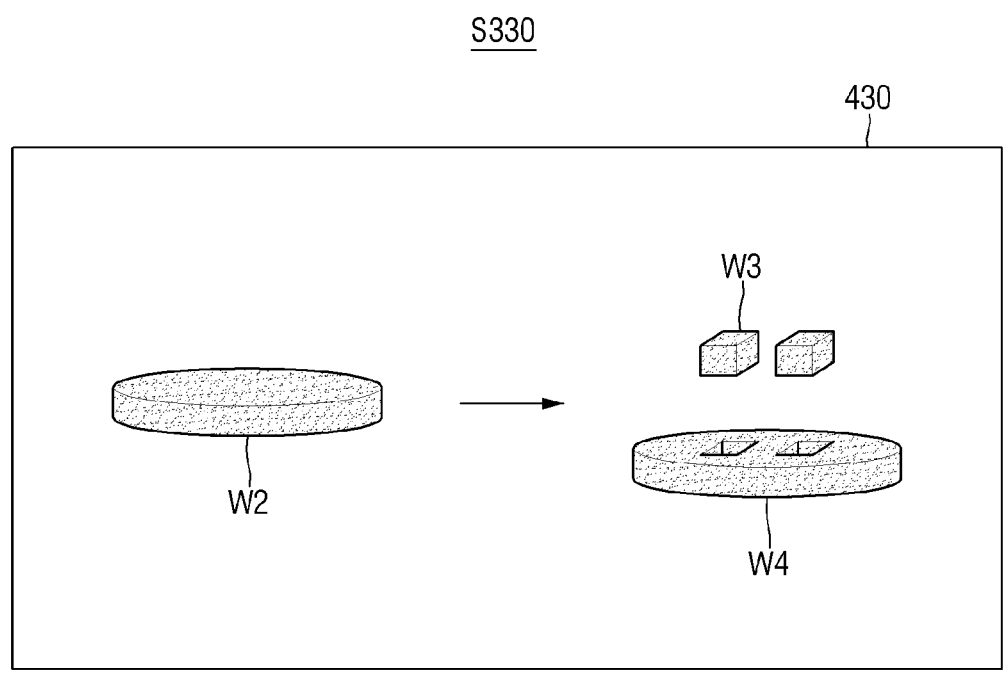
FIG. 13 is a diagram for explaining operation S330 of FIG. 10.
Figure 14:
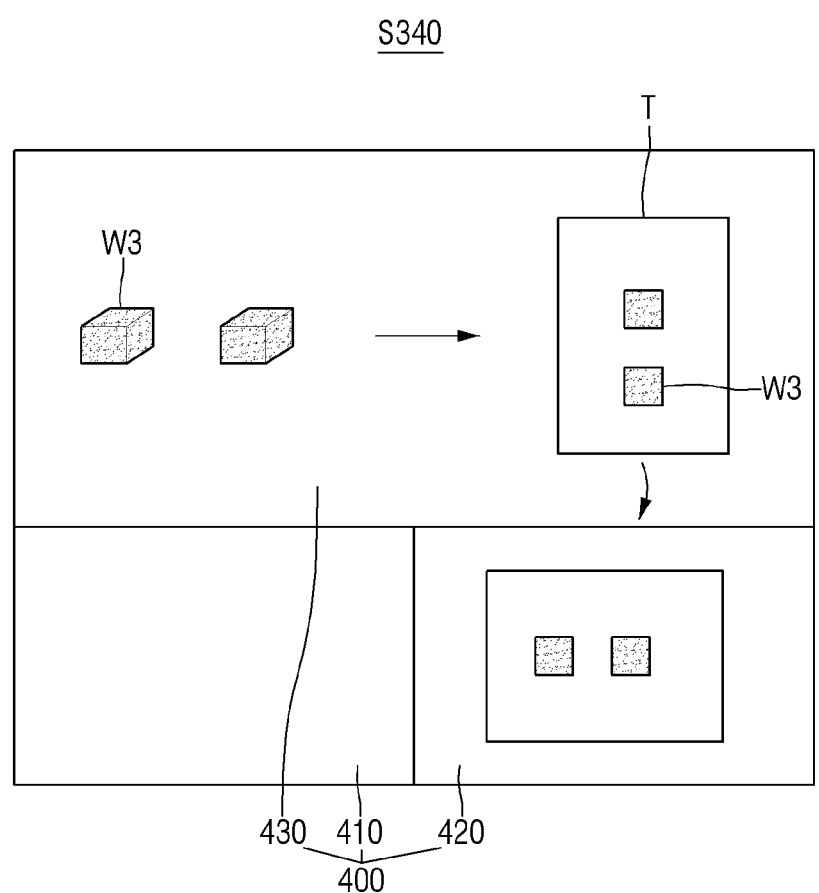
FIG. 14 is a diagram for explaining operation S340 of FIG. 10.
Figure 15:
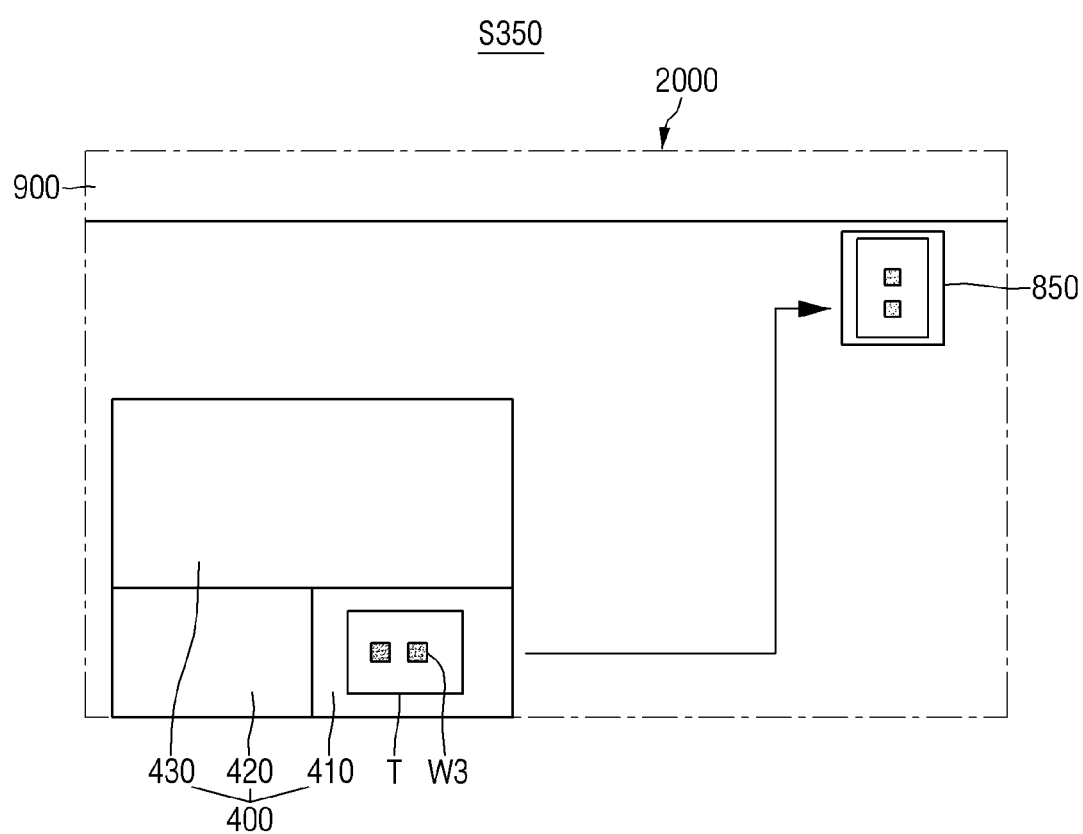
FIG. 15 is a diagram for explaining operation S350 of FIG. 10.

FIG. 10 is a flowchart for explaining operation S300 of FIG. 3. FIG. 11 is a diagram for explaining operation S310 of FIG. 10. FIG. 12 is a diagram for explaining operation S320 of FIG. 10. FIG. 13 is a diagram for explaining operation S330 of FIG. 10. FIG. 14 is a diagram for explaining operation S340 of FIG. 10. FIG. 15 is a diagram for explaining operation S350 of FIG. 10. Hereinafter, operation S300 of FIG. 4 will be described referring to FIGS. 10 to 15.

Referring to FIGS. 10 to 15, the operation of forming the test wafer piece (S300) may include an operation of loading the second FOUP F2 into first port 410 of the pre-processing module 400 (S310), an operation of loading the second wafer W2 (S320), an operation of forming the first test wafer piece W3 (S330), an operation of storing the first test wafer piece W3 in the tray T (S340), and an operation of unloading the tray T from the second port 420 (350).

In FIG. 11, the second FOUP F2 unloaded from the wafer stocker 300 may be transported to the pre-processing module 400 along the transfer rail 900.

The second FOUP F2 may include the second wafer W2. The second FOUP F2 may be loaded into the first port 410 of the pre-processing module 400 (S310). The hand included in the FOUP transfer module 800 may grip the second FOUP F2 and move the second FOUP F2 in the vertical direction. The hand may load the second FOUP F2 into the first port 410 of the pre-processing module 400.

The pre-processing module 400 may include a first port 410, a second port 420, and a pre-processing chamber 430. The first port 410 may be a region into which the second FOUP F2 transported from the wafer stocker 300 is loaded. Further, the first port 410 may be a region from which the second FOUP F2 to be conveyed to the wafer stocker 300 is unloaded. The second port 420 may be a region from which the tray T is unloaded from the pre-processing module 400. Further, the second port 420 may be a region into which the tray T for transporting the first test wafer piece W3 generated by the pre-processing module 400 is loaded. The pre-processing chamber 430 may be a region in which the first test wafer piece W3 is formed.

In FIG. 12, the second wafer W2 may be loaded into the pre-processing chamber 430 (S320). Specifically, the second FOUP F2 may be loaded into the first port 410, and the second wafer W2 inside the second FOUP F2 may be loaded into the pre-processing chamber 430.

In FIG. 13, the first test wafer piece W3 and the disposal wafer W4 may be formed (S330).

The first test wafer piece W3 and the disposal wafer W4 may be formed inside the pre-processing chamber 430. The first test wafer piece W3 may be a rectangular parallelepiped piece obtained from the second wafer W2. However, example embodiments are not limited thereto, and the first test wafer piece W3 may have a regular hexahedron shape or a columnar shape. The disposal wafer W4 may be a wafer which remains after the first test wafer piece W3 is formed in the second wafer W2.

The first test wafer piece W3 may be formed at random positions of the second wafer W2. For example, as an example, the first test wafer piece W3 may be formed in a central region of the second wafer W2, and may be formed in an edge region of the second wafer W2 as another example. Furthermore, although two first test wafer pieces W3 are shown as being formed in the single second wafer W2, this is only for convenience of explanation, and example embodiments are not limited thereto.

After forming the first test wafer piece W3, the pre-processing module 400 may generate a second ID including information of the first test wafer piece W3. The first test wafer piece W3 may include a second ID.

In FIG. 14, the first test wafer piece W3 may be stored in the tray T (S340).

The tray T may store a plurality of first test wafer pieces (W3). The tray T may be used to transport the first test wafer piece W3. The tray T may be transferred from the pre-processing chamber 430 to the second port 420.

In FIG. 15, the tray T may be unloaded from the second port 420 (S350).

The tray T may be unloaded from the pre-processing module 400. The tray T may be moved from the second port 420 to the tray transfer module 850. The tray transfer module 850 may transport the tray T. The tray transfer module 850 may move along the transfer rail 900.

The tray transfer module 850 may include a hand (e.g., a robotic hand). The hand may grip the tray T. In addition, the hand may move in the vertical direction. For example, the hand of the tray transfer module 850 may descend in the vertical direction to grip the tray T that is unloaded from the second port 420 of the pre-processing module 400. The hand may ascend in the vertical direction again to load the tray T into the tray transfer module 850.

Figure 16:
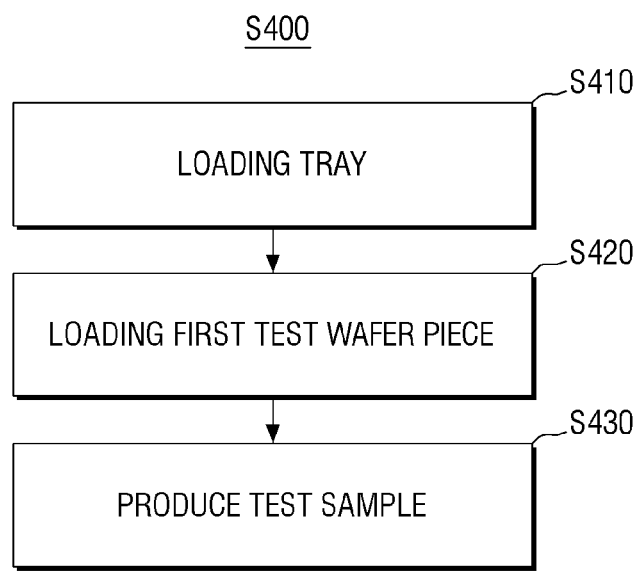
FIG. 16 is a flowchart for explaining operation S400 of FIG. 3.
Figure 17:
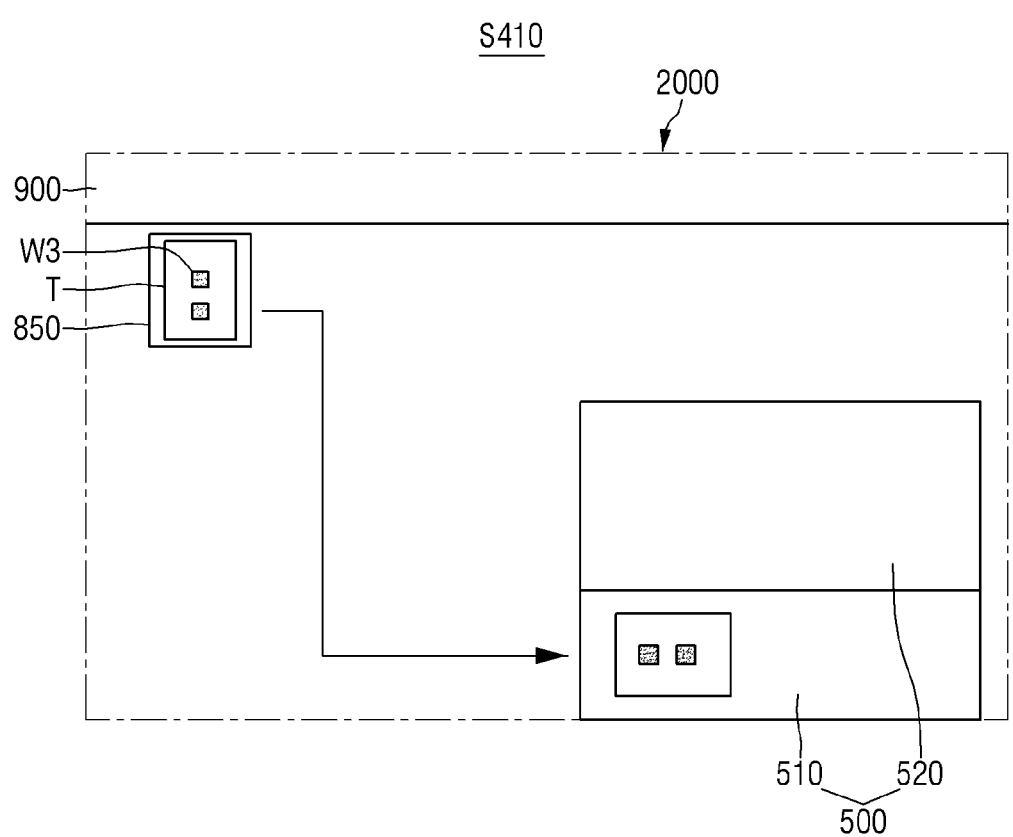
FIG. 17 is a diagram for explaining operation S410 of FIG. 16.
Figure 18:
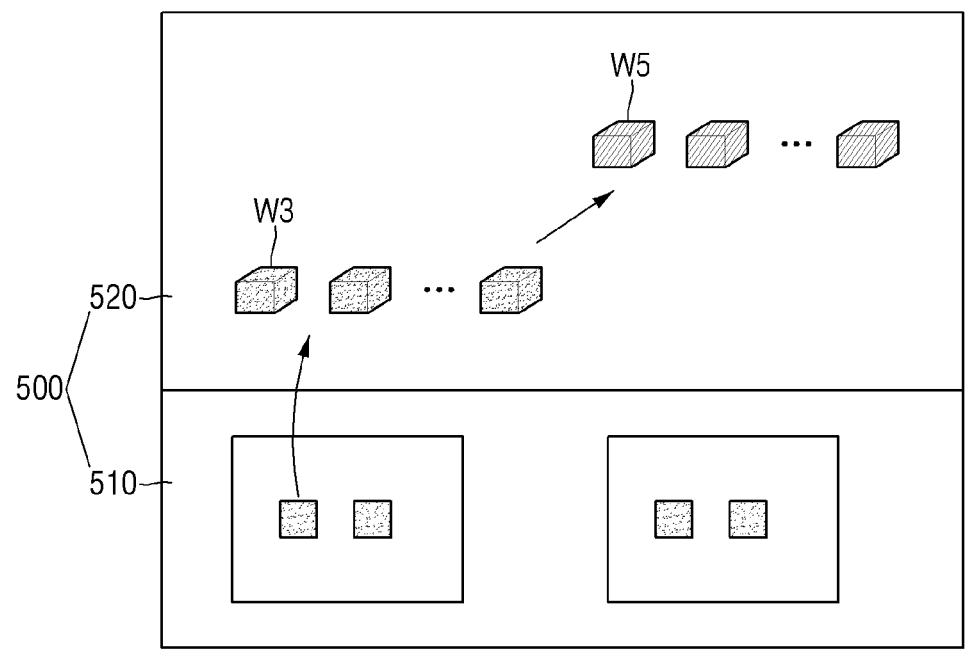
FIG. 18 is a diagram for explaining operation S420 and operation S430 of FIG. 16.

FIG. 16 is a flowchart for explaining operation S400 of FIG. 3. FIG. 17 is a diagram for explaining operation S410 of FIG. 16. FIG. 18 is a diagram for explaining operation S420 and operation S430 of FIG. 16. Hereinafter, the operation S400 will be described referring to FIGS. 16 to 18.

Referring to FIGS. 16 to 18, the operation of producing the test sample (S400) may include an operation of loading the tray T (S410), an operation of loading the first test wafer piece W3 (S420), and an operation of producing the test sample (S430).

In FIG. 17, the tray T may be loaded into the sample production module 500 along the transfer rail 900 (S410).

The hand of the tray transfer module 850 may unload the tray T from the tray transfer module 850. The hand may grip the tray T and move in the vertical direction. The hand descends in the vertical direction and may load the tray T into the third port 510 of the sample production module 500.

The sample production module 500 may include a third port 510 and a sample production chamber 520. The third port 510 may be a region into which the tray T, in which the first test wafer piece W3 is placed, is loaded. The sample production chamber 520 may be a region in which a sample for analyzing the first test wafer piece W3 is produced. The third port 510 may be a region from which the tray T, in which the second test wafer piece W5 is placed, is unloaded.

In FIG. 18, the first test wafer piece W3 may be unloaded from the tray T inside the third port 510.

The first test wafer piece W3 may be loaded into the sample production chamber 520 (S420). The first test wafer piece W3 may be fixed to the stub of the tray T. A shuttle inside the third port 510 may grip the stub of the tray T and transport the stub to the sample production chamber 520.

A sample for analyzing the wafer may be produced inside the sample production chamber 520 (S430). When the sample production is completed, the first test wafer piece W3 may be changed to the second test wafer piece W5.

Subsequently, the second test wafer piece W5 may be stored in the tray T again. The tray T may be unloaded from the sample production module 500 via the third port 510.

Figure 19:
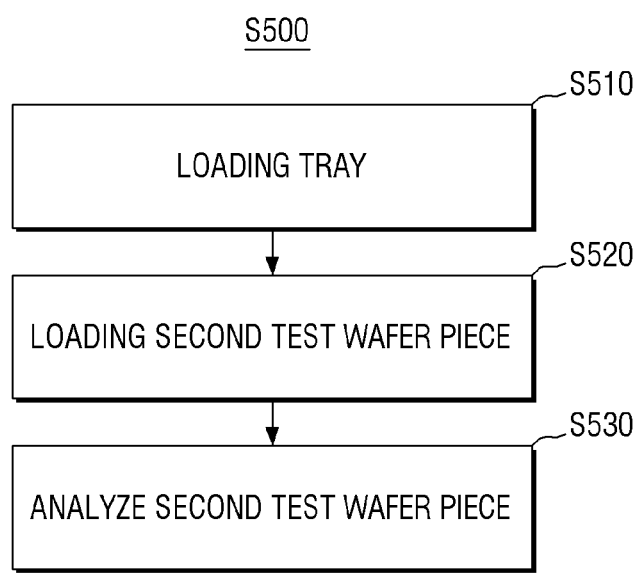
FIG. 19 is a flowchart for explaining operation S500 of FIG. 3.
Figure 20:
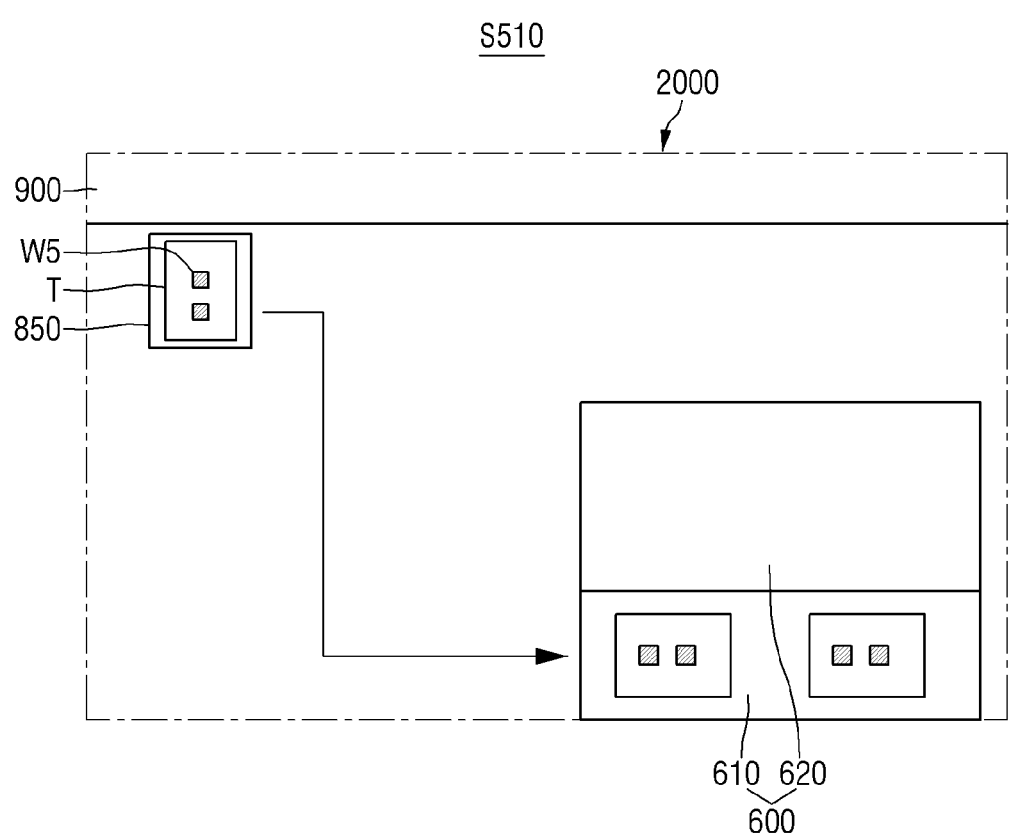
FIG. 20 is a diagram for explaining operation S510 of FIG. 19.
Figure 21:
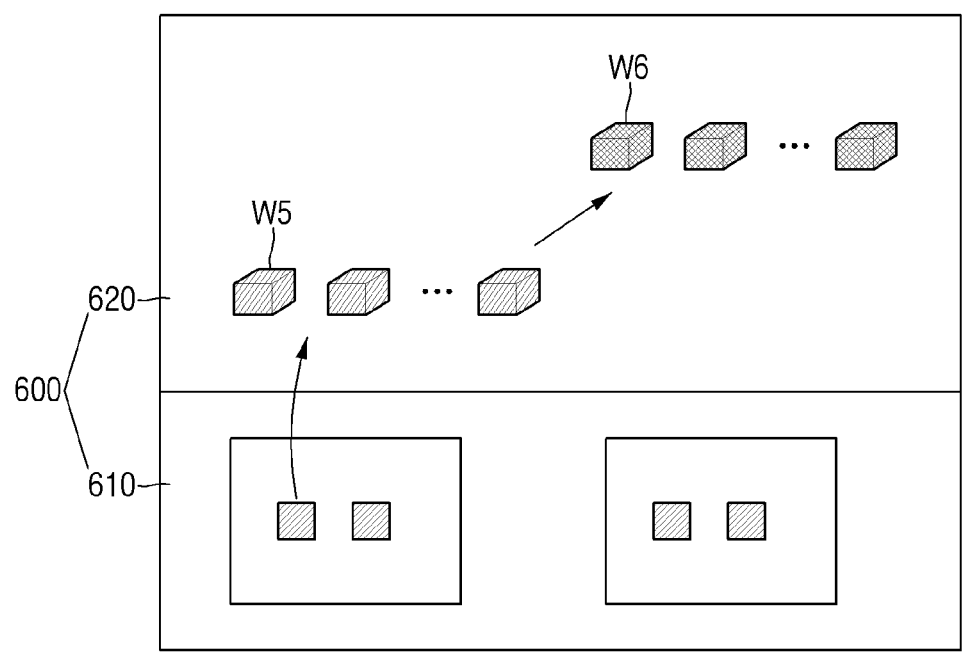
FIG. 21 is a diagram for explaining operation S520 and operation S530 of FIG. 19.

FIG. 19 is a flowchart for explaining operation S500 of FIG. 3. FIG. 20 is a diagram for explaining operation S510 of FIG. 19. FIG. 21 is a diagram for explaining operation S520 and operation S530 of FIG. 19. Hereinafter, the operation S500 will be described referring to FIGS. 19 to 21.

Referring to FIGS. 19 to 21, an operation of analyzing the wafer (S500) may include an operation of loading the tray T (S510), an operation of loading the second test wafer piece W5 (S520), and an operation of analyzing the second test wafer piece W5 (S530).

In FIG. 20, the tray T, in which the second test wafer piece W5 is placed, may be loaded into the analysis module 600 (S510).

The tray T is placed in the tray transfer module 850 and transported. The tray transfer module 850 may move along the transfer rail 900. The tray T, in which the second test wafer piece W5 is placed, may be loaded into a fourth port 610 of the analysis module 600. The hand of the tray transfer module 850 may unload the tray T from the tray transfer module 850. The hand may grip the tray T and move in the vertical direction. The hand descends in the vertical direction and may load the tray T into the fourth port 610 of the analysis module 600.

The analysis module 600 may include a fourth port 610 and an analysis chamber 620. The fourth port 610 may be a region into which the tray T, in which the second test wafer piece W5 is placed, is loaded. The analysis chamber 620 may be a region in which the second test wafer piece W5 is photographed and analyzed. Further, the fourth port 610 may be a space from which the third test wafer piece W6, formed after photographing and analyzing the second test wafer piece W5, is unloaded. The third test wafer piece W6 may be placed in the tray T and unloaded.

In FIG. 21, the second test wafer piece W5 may be loaded into the analysis chamber 620 from the tray T in the fourth port 610 (S520).

The second test wafer piece W5 may be fixed to a stub of the tray T. A shuttle in the fourth port 610 may grip the stub of the tray T and transport the stub to the analysis chamber 620.

The second test wafer piece W5 may be photographed and analyzed inside the analysis chamber 620 (S530). When the analysis is completed, the second test wafer piece W5 may be changed to the third test wafer piece W6.

Next, the third test wafer piece W6 may be stored in the tray T again. The tray T may be unloaded from the analysis module 600 via the fourth port 610.

Figure 22:
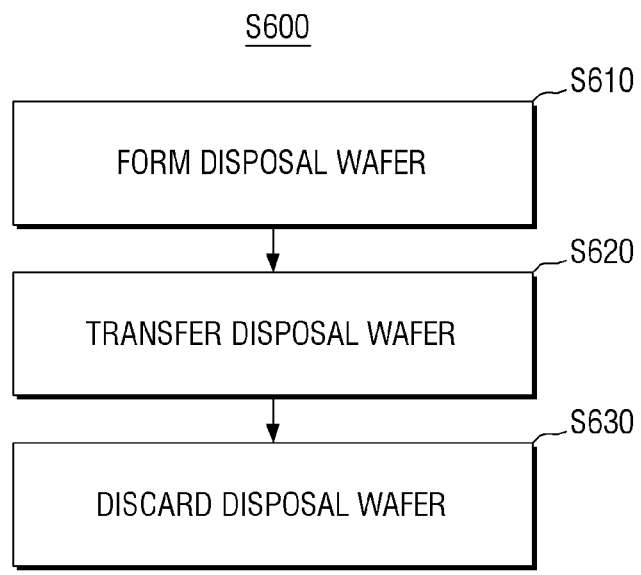
FIG. 22 is a flowchart for explaining operation S600.
Figure 23:
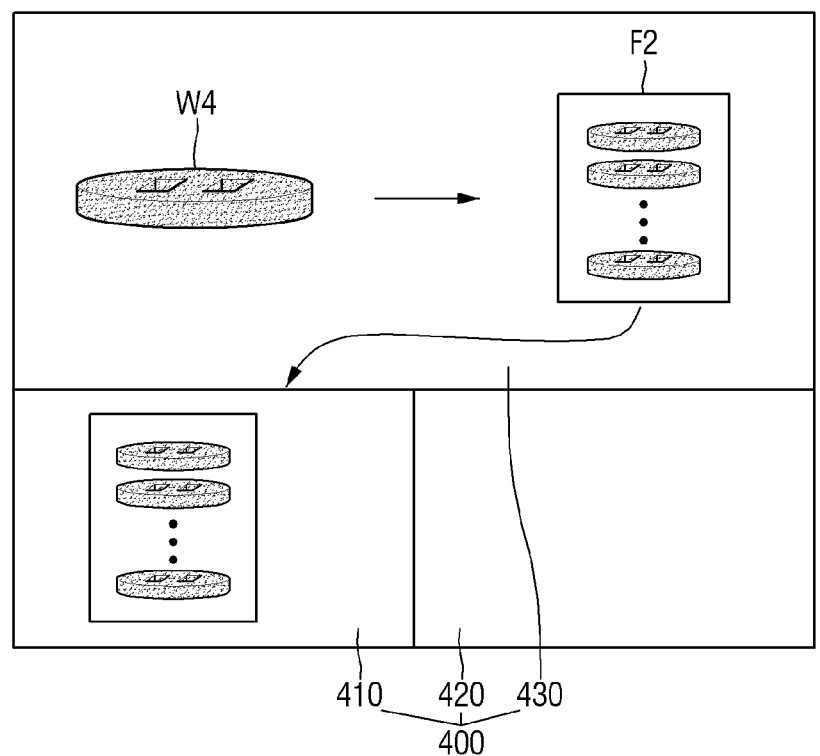
FIG. 23 is a diagram for explaining operation S610 of FIG. 22.
Figure 24:
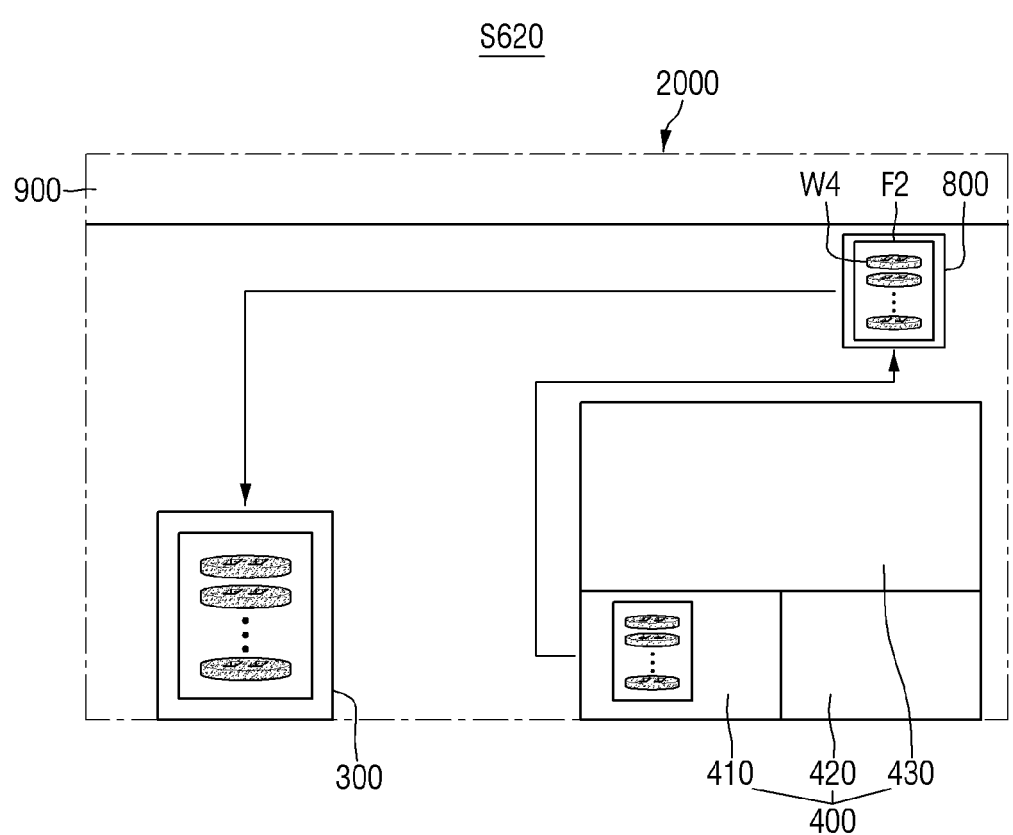
FIG. 24 is a diagram for explaining operation S620 of FIG. 22.
Figure 25:
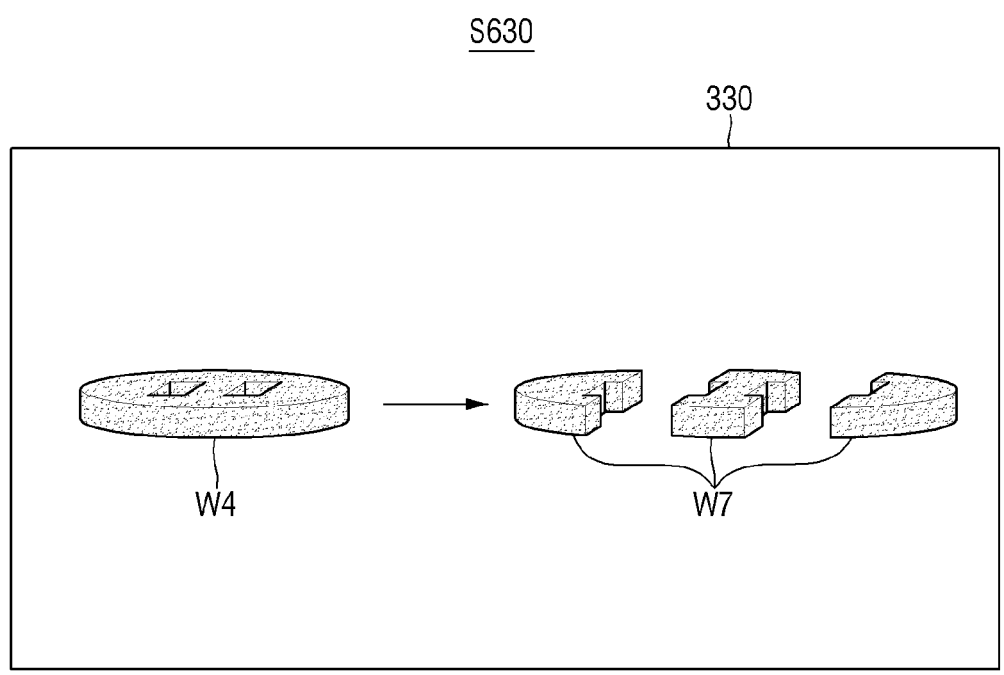
FIG. 25 is a diagram for explaining operation S630 of FIG. 22.

FIG. 22 is a flowchart for explaining operation S600. FIG. 23 is a diagram for explaining operation S610 of FIG. 22. FIG. 24 is a diagram for explaining operation S620 of FIG. 22. FIG. 25 is a diagram for explaining operation S630 of FIG. 22. Hereinafter, operation S600 will be described referring to FIGS. 22 to 25.

Referring to FIG. 22, a substrate analysis method according to some example embodiments may further include an operation of discarding the wafer (S600).

The operation of discarding the wafer (S600) may include an operation of forming the disposal wafer W4 (S610), an operation of transferring the disposal wafer W4 (S620), and an operation of discarding the disposal wafer W4 (S630). Each operation will be described in detail referring to FIGS. 13, 23 to 25.

Referring to FIG. 13, the disposal wafer W4 may be formed inside the pre-processing chamber 430 of the pre-processing module 400 (S610).

The disposal wafer W4 may be a portion which remains after the first test wafer piece W3 is formed in the second wafer W2. The disposal wafer W4 is not used to analyze the wafer. Therefore, another process of discarding the disposal wafer W4 may be performed.

Referring to FIG. 23, the disposal wafer W4 may be placed in the second FOUP F2 inside the pre-processing chamber 430. The second FOUP F2 may store the disposal wafer W4. The second FOUP F2 may be moved from the pre-processing chamber 430 to the first port 410.

Next, referring to FIG. 24, the disposal wafer W4 may be transported along the transfer rail 900. The disposal wafer W4 may be placed in the second FOUP F2. The second FOUP F2 may be placed in the FOUP transfer module 800. The hand of the FOUP transfer module 800 may descend in the vertical direction to grip the second FOUP F2. The hand may grip the second FOUP F2 and ascend in the vertical direction. The hand may load the second FOUP F2 into the FOUP transfer module 800.

The FOUP transfer module 800 may be transported along the transfer rail 900. The FOUP transfer module 800 may transport the second FOUP F2 from the pre-processing module 400 to the wafer stocker 300 along the transfer rail 900. That is, the disposal wafer W4 is unloaded from the pre-processing module 400 and loaded into the wafer stocker 300.

Referring to FIG. 25, the disposal wafer W4 may be discarded (S630). The disposal wafer W4 may be cut to form a plurality of cut wafers W7. The disposal wafer W4 may be discarded inside the disposal chamber 330 of the wafer stocker 300.

Figure 26:
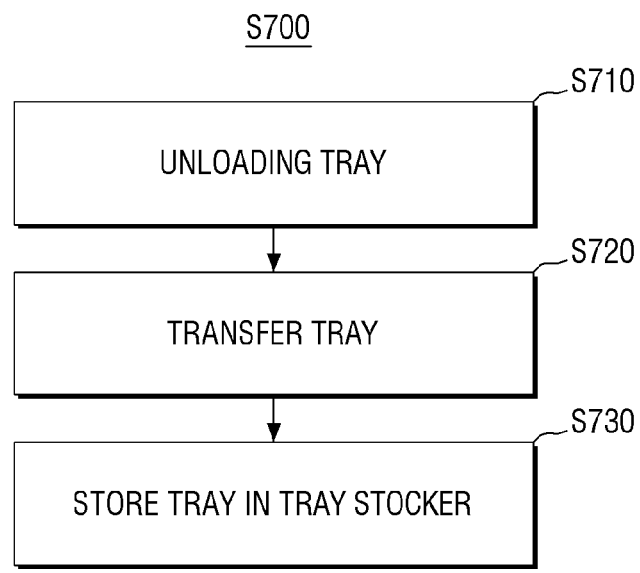
FIG. 26 is a flowchart for explaining operation S700.
Figure 27A:
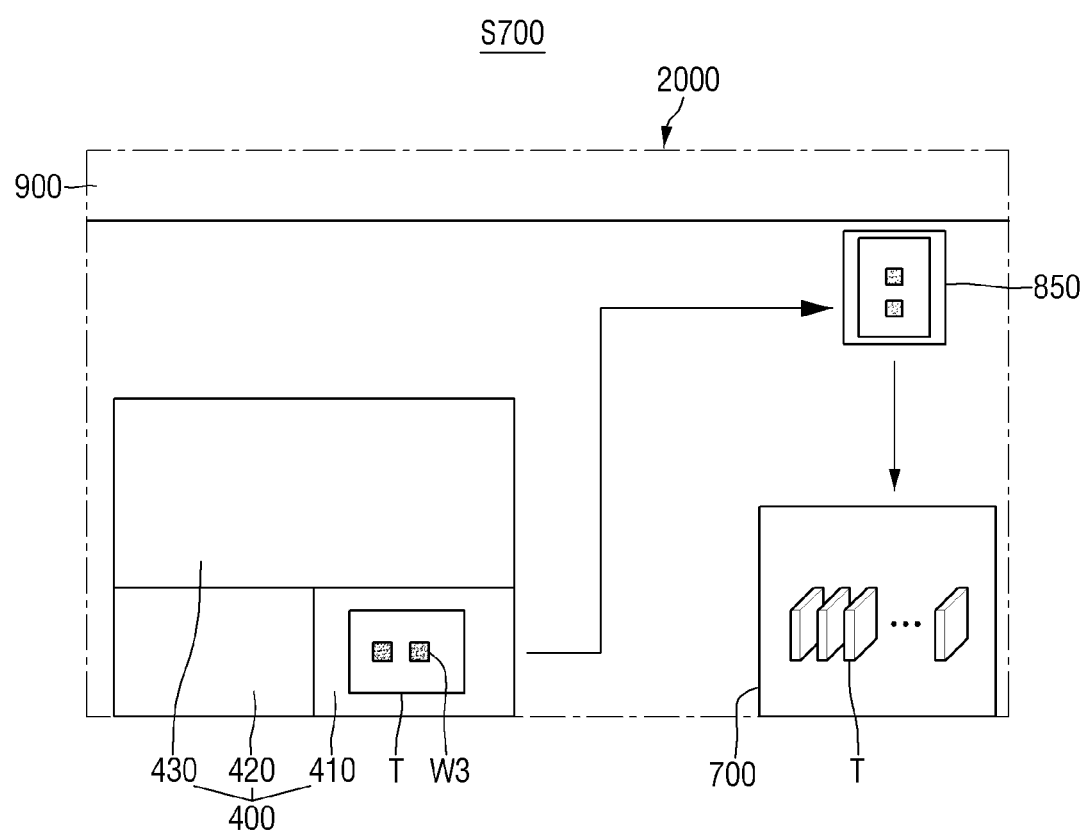
FIGS. 27A, 27B and 27C are diagrams for explaining operation S700.
Figure 27B:
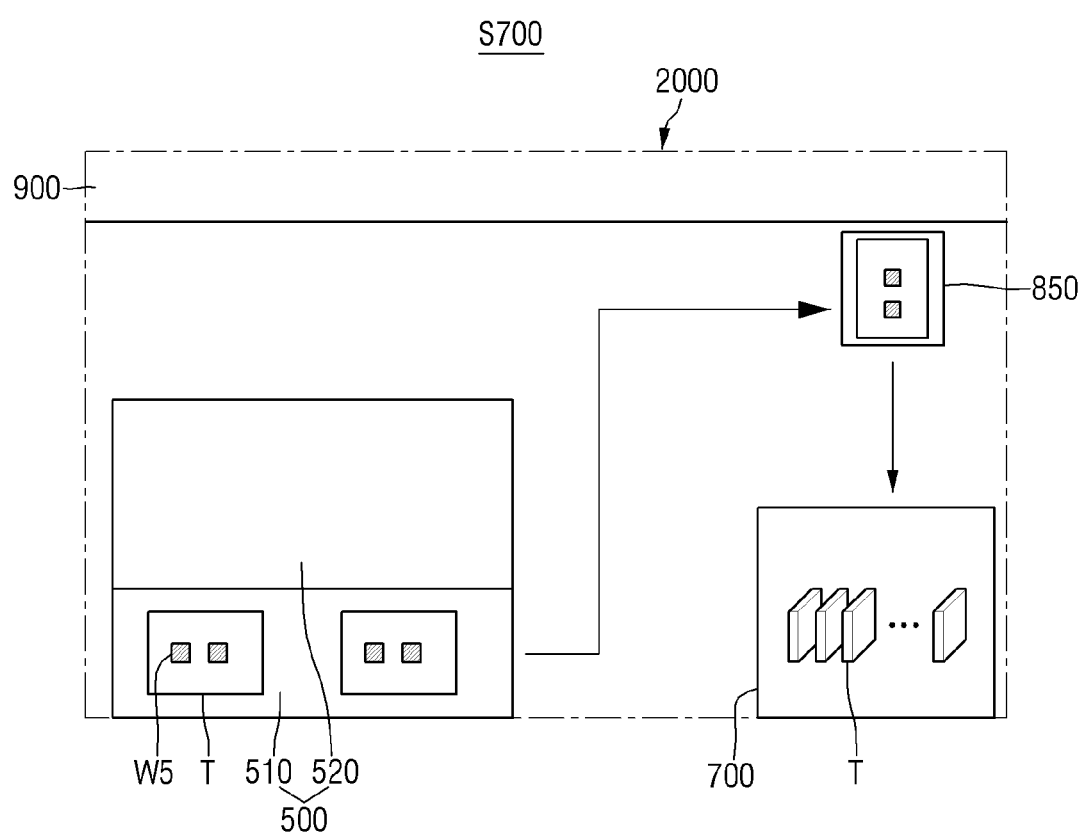
Figure 27C:
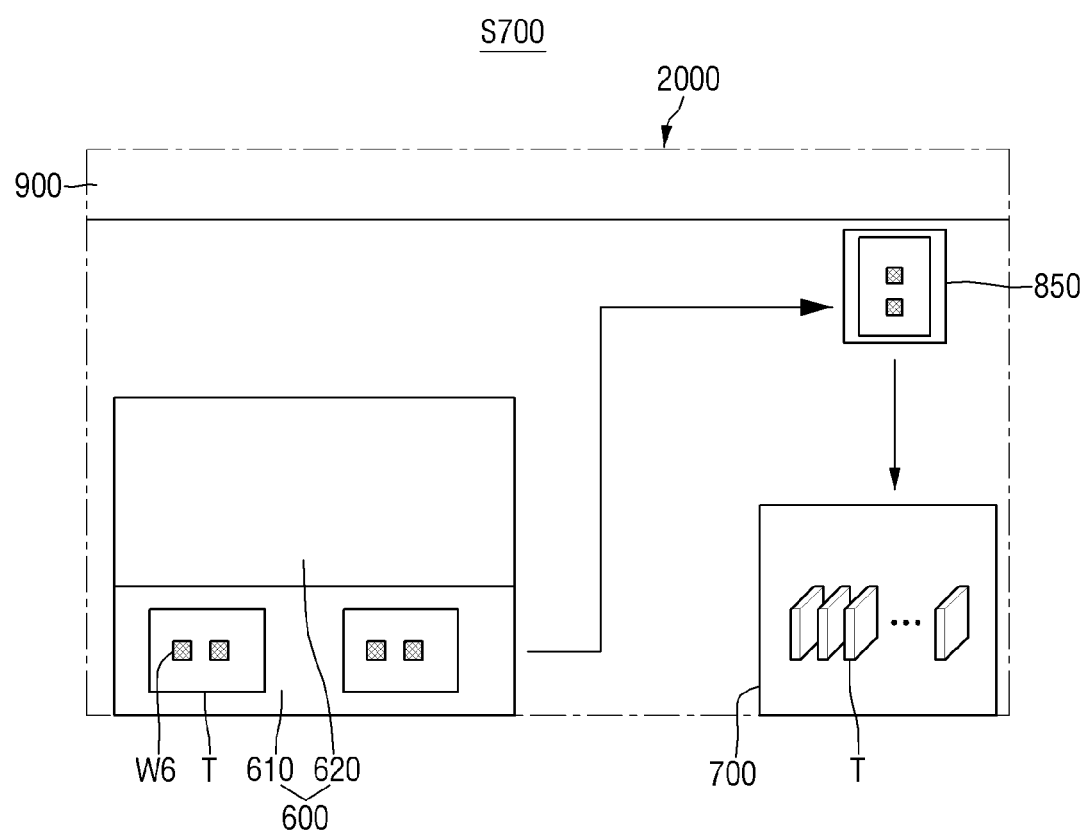

FIG. 26 is a flowchart for explaining operation S700. FIGS. 27A to 27C are diagrams for explaining operation S700. Hereinafter, operation S700 will be described in detail referring to FIGS. 26 to 27C.

Referring to FIGS. 26 to 27C, a substrate analysis method according to some example embodiments may further include an operation of storing the tray (S700).

The operation of storing the tray (S700) may include an operation of unloading the tray T (S710), an operation of transferring the tray T (S720), and an operation of storing the tray T in the tray stocker 700 (S730).

As described above, the first test wafer piece W3, the second test wafer piece W5, and the third test wafer piece W6 may be placed and stored in the tray T. Before producing the sample, the first test wafer piece W3 may be placed and stored in the tray T. After the sample is produced, and before the wafer analysis, the second test wafer piece W5 may be placed and stored in the tray. The third test wafer piece W6 for which the wafer analysis has been completed may be placed and stored in the tray T.

Specifically, when the sample production module 500 is in the full loading state, the first test wafer piece W3 is placed in the tray T and stored in the tray stocker 700. When the analysis module 600 is in the full loading state, the second test wafer piece W5 is placed in the tray T and stored in the tray stocker 700. The third test wafer piece W6, for which photographing/analysis have been completed, is placed in the tray T and stored in the tray stocker 700.

The operation of unloading the tray T (S710) may include an operation of unloading the tray T from the pre-processing module 400, an operation of unloading the tray T from the sample production module 500, and an operation of unloading the tray T from the analysis module 600.

In FIG. 27A, the tray T may be unloaded from the pre-processing module 400. The tray T may include the first test wafer piece W3. The tray T may be placed in the tray transfer module 850 and transported along the transfer rail 900. The tray T may be loaded into the tray stocker 700.

When the sample production module 500 is in the full loading state, the first test wafer piece W3 may not be immediately transported to the sample production module 500. In this case, the first test wafer piece W3 may be placed in the tray T and stored in the tray stocker 700. When the sample production module 500 is not in the full loading state, the first test wafer piece W3 stored in the tray stocker 700 may be transported and loaded into the sample production module 500.

In FIG. 27B, the tray T may be unloaded from the sample production module 500. The tray T may include the second test wafer piece W5. The tray T may be placed in the tray transfer module 850 and transported along the transfer rail 900. The tray T may be loaded into the tray stocker 700.

When the analysis module 600 is in the full loading state, the second test wafer piece W5 may not be immediately transported to the analysis module 600. In this case, the second test wafer piece W5 may be placed in the tray T and stored in the tray stocker 700. When the analysis module 600 is not in the full loading state, the second test wafer piece W5 stored in the tray stocker 700 may be transported and loaded into the analysis module 600.

In FIG. 27C, the tray T may be unloaded from the analysis module 600. The tray T may include a third test wafer piece W6. The tray T may be placed in the tray transfer module 850 and transported along the transfer rail 900. The tray T may be loaded into the tray stocker 700.

The third test wafer piece W6 for which the analysis has been completed may be placed in the tray T and unloaded from the analysis module 600. The tray stocker 700 may store the third test wafer piece W6.

At least one of the components, elements, modules or units represented by a block as illustrated in FIGS. 1, 2, 5A, 5B, 6, 8, 9, 11-15, 17, 18, 20, 21, 23-25, 27A, 27B and 27C, may be embodied as various numbers of hardware, software and/or firmware structures that execute respective functions described above, according to example embodiments. For example, at least one of these components, elements, modules or units may include various hardware components including motors, sensors, actuators, cameras, processors or memories. Each of the hardware components may include circuitry using use a direct circuit structure, such as a memory, a processor, a logic circuit, a look-up table, etc. that may execute the respective functions through controls of one or more microprocessors or other control apparatuses. Also, at least one of these components, elements, modules or units may include a module, a program, or a part of code, which contains one or more executable instructions for performing specified logic functions, and executed by one or more microprocessors or other control apparatuses. Also, at least one of these components, elements, modules or units may further include or may be implemented by a processor such as a central processing unit (CPU) that performs the respective functions, a microprocessor, or the like. Functional aspects of the above exemplary embodiments may be implemented in algorithms that execute on one or more processors. Furthermore, the components, elements, modules or units represented by a block or processing steps may employ any number of related art techniques for electronics configuration, signal processing and/or control, data processing and the like.

While aspects of example embodiments have been particularly shown and described, it will be understood that various changes in form and details may be made therein without departing from the spirit and scope of the following claims.

What is claimed is:
1. A substrate analysis apparatus comprising:
an interlayer conveying module which is provided in a first region of the substrate analysis apparatus, and configured to transport a first Front Opening Unified Pod (FOUP) configured to store a plurality of wafers in a vertical direction;
an exchange module which is connected to the interlayer conveying module, and configured to transfer a wafer, from among the plurality of wafers, from the first FOUP to a second FOUP provided in a second region of the substrate analysis apparatus different from the first region;
a pre-processing module which is provided in the second region, and configured to form a test wafer piece using the wafer inside the second FOUP;
an analysis module which is provided in the second region, and configured to analyze the test wafer piece; and a transfer rail which is provided in the second region, and configured to transport the second FOUP containing the wafer and a tray containing the test wafer piece,
wherein the wafer comprises a first identifier indicating information corresponding to the wafer,
the test wafer piece comprises a second identifier indicating information generated by the pre-processing module which corresponds to the test wafer piece, and
the analysis module is configured to analyze the first identifier and the second identifier in connection with each other.

2. The substrate analysis apparatus of claim 1, wherein the pre-processing module comprises a first port configured to receive the second FOUP, and a second port configured to receive the tray.

3. The substrate analysis apparatus of claim 1, further comprising a tray transfer module configured to control the tray to be transported on the transfer rail.

4. The substrate analysis apparatus of claim 1, further comprising a sample production module which is provided in the second region and configured to produce a sample for analyzing the test wafer piece.

5. The substrate analysis apparatus of claim 1, further comprising a FOUP transfer module configured to control the second FOUP to be transported on the transfer rail.

6. The substrate analysis apparatus of claim 1, further comprising a wafer stocker which is provided in the second region, and configured to computerize and store the wafer.

7. The substrate analysis apparatus of claim 6, wherein the wafer stocker is further configured to discard a portion of the wafer which remains after the test wafer piece is formed.

8. The substrate analysis apparatus of claim 1, further comprising a tray stocker configured to computerize and store the test wafer piece, and generate a tray identifier indicating information corresponding to the tray.

9. The substrate analysis apparatus of claim 8, wherein the tray stocker is further configured to sort and stack the test wafer piece inside the tray,
the tray identifier indicates information about the second identifier, and
the substrate analysis apparatus is configured to centrally control and track the tray.

10. The substrate analysis apparatus of claim 1, wherein the first region is a region in which a semiconductor process is performed, and
the second region is a region in which wafer analysis is performed.

11. A substrate analysis apparatus comprising:
an exchange module configured to transfer a wafer between a process chamber and an analysis chamber;
a pre-processing module which is provided on a bottom surface of the analysis chamber and configured to form a test wafer piece using the wafer;
an analysis module which is provided on the bottom surface of the analysis chamber and configured to analyze the test wafer piece; and
a transfer rail which is provided on a ceiling of the analysis chamber and configured to transport the wafer from the exchange module to the pre-processing module, and a tray containing the test wafer piece from the pre-processing module to the analysis module.

12. The substrate analysis apparatus of claim 11, further comprising a wafer stocker which is provided on the bottom surface of the analysis chamber, and configured to computerize and store the wafer.

13. The substrate analysis apparatus of claim 11, further comprising a sample production module which is provided on the bottom surface of the analysis chamber and configured to produce a sample for analyzing the test wafer piece,
wherein the substrate analysis apparatus is configured to place the test wafer piece in the tray and sequentially transport the tray to the pre-processing module, the sample production module, and the analysis module.

14. The substrate analysis apparatus of claim 11, further comprising:
a first identifier configured to store information about the wafer; and
a second identifier configured to store information about the test wafer piece generated by the pre-processing module,
wherein the analysis module is further configured to analyze the first identifier and the second identifier in connection with each other.

15. The substrate analysis apparatus of claim 11, further comprising a tray stocker configured to computerize and store the test wafer piece, and generate a tray identifier indicating information corresponding to the tray.

16. The substrate analysis apparatus of claim 15, further comprising a second identifier configured to store information about the test wafer piece generated by the pre-processing module,
wherein the tray stocker is further configured to automatically sort and stack the test wafer piece inside the tray,
the tray identifier indicates information about the second identifier, and
the substrate analysis apparatus is configured to centrally control and track the tray identifier.

17. A substrate analysis method comprising:
transferring a first Front Opening Unified Pod (FOUP) in which a plurality of wafers are stored, using an interlayer conveying module provided in a first region of a substrate analysis apparatus, information about a wafer, from among the plurality of wafers, being stored in a first identifier;
transferring the wafer from the first region to a second region of the substrate analysis apparatus different from the first region, using an exchange module connected to the interlayer conveying module, the wafer being stored in a second FOUP inside the exchange module;
transferring the wafer from the exchange module to a pre-processing module along a transfer rail provided in the second region;
forming a test wafer piece using the pre-processing module;
generating a second identifier indicating information corresponding to the test wafer piece;
placing the test wafer piece in a tray;
transferring the tray containing the test wafer piece to an analysis module along the transfer rail;
analyzing the test wafer piece, using the analysis module; and
analyzing the first identifier and the second identifier in connection with each other.

18. The substrate analysis method of claim 17, further comprising:
loading the second FOUP through a first port of the pre-processing module; and
loading the tray through a second port of the pre-processing module.

19. The substrate analysis method of claim 18, further comprising:
unloading the wafer from the second FOUP inside the pre-processing module; and loading the test wafer piece into the tray inside the pre-processing module.

20. The substrate analysis method of claim 17, further comprising producing a sample for testing the test wafer piece using a sample production module provided in the second region.

\* \* \* \* \*